US011557501B2

(12) United States Patent
Gangakhedkar et al.

(10) Patent No.: US 11,557,501 B2
(45) Date of Patent: Jan. 17, 2023

(54) CONTOUR POCKET AND HYBRID SUSCEPTOR FOR WAFER UNIFORMITY

(71) Applicant: Applied Materials, Inc., Santa Clara, CA (US)

(72) Inventors: Kaushal Gangakhedkar, San Jose, CA (US); Kallol Bera, Fremont, CA (US); Joseph Yudovsky, Campbell, CA (US)

(73) Assignee: Applied Materials, Inc., Santa Clara, CA (US)

( * ) Notice: Subject to any disclaimer, the term of this patent is extended or adjusted under 35 U.S.C. 154(b) by 102 days.

(21) Appl. No.: 16/902,253

(22) Filed: Jun. 15, 2020

(65) Prior Publication Data

US 2020/0312702 A1 Oct. 1, 2020

Related U.S. Application Data

(62) Division of application No. 15/616,364, filed on Jun. 7, 2017, now Pat. No. 10,685,864.

(60) Provisional application No. 62/347,062, filed on Jun. 7, 2016.

(51) Int. Cl.
*H01L 21/687* (2006.01)
*H01L 21/683* (2006.01)
*H01L 21/67* (2006.01)

(52) U.S. Cl.
CPC .. *H01L 21/68764* (2013.01); *H01L 21/67017* (2013.01); *H01L 21/6838* (2013.01); *H01L 21/6875* (2013.01); *H01L 21/68735* (2013.01); *H01L 21/68757* (2013.01); *H01L 21/68771* (2013.01); *H01L 21/68785* (2013.01)

(58) Field of Classification Search
CPC . H01L 21/68; H01L 21/682; H01L 21/68714; H01L 21/38728; H01L 21/68771; H01L 21/68778; H01L 21/6838; H01L 21/6875; H01L 21/68764; H01L 21/67017; H01L 21/68735; H01L 21/68757; H01L 21/68785; B25B 11/00; B25B 11/02
USPC ................................ 269/21, 40, 289 R, 903
See application file for complete search history.

(56) References Cited

U.S. PATENT DOCUMENTS

| | | | |
|---|---|---|---|
| 5,074,017 A | 12/1991 | Toya et al. | |
| 5,580,388 A | 12/1996 | Moore | |
| 6,634,314 B2 | 10/2003 | Hwang et al. | |
| 8,562,746 B2 | 10/2013 | Gurary et al. | |
| 9,637,822 B2 | 5/2017 | Bergmann et al. | |
| 10,134,617 B2 | 11/2018 | Gurary et al. | |
| 10,197,385 B2 | 2/2019 | Khandelwal et al. | |
| 2006/0102081 A1 | 5/2006 | Ueno et al. | |
| 2006/0231035 A1 | 10/2006 | Hellwig | |
| 2007/0218702 A1 | 9/2007 | Shimizu et al. | |
| 2008/0149590 A1 | 6/2008 | Maeda et al. | |

(Continued)

FOREIGN PATENT DOCUMENTS

| | | |
|---|---|---|
| JP | 2003142412 A | 5/2003 |
| JP | 2015046536 A | 3/2015 |

(Continued)

*Primary Examiner* — Lee D Wilson
*Assistant Examiner* — Alberto Saenz
(74) *Attorney, Agent, or Firm* — Servilla Whitney LLC

(57) ABSTRACT

Susceptor assemblies comprising a susceptor base and a plurality of pie-shaped skins thereon are described. A pie anchor can be positioned in the center of the susceptor base to hold the pie-shaped skins in place during processing.

9 Claims, 16 Drawing Sheets

(56) References Cited

U.S. PATENT DOCUMENTS

| | | | |
|---|---|---|---|
| 2012/0234229 A1 | 9/2012 | Nguyen et al. | |
| 2013/0118407 A1* | 5/2013 | Park | H01L 21/67109 |
| | | | 118/725 |
| 2013/0291798 A1 | 11/2013 | Lee et al. | |
| 2015/0187620 A1* | 7/2015 | Gurary | H01L 21/68735 |
| | | | 118/728 |
| 2015/0376786 A1* | 12/2015 | Yudovsky | C23C 16/45565 |
| | | | 118/730 |
| 2016/0281227 A1* | 9/2016 | Kobayashi | C23C 16/4584 |

FOREIGN PATENT DOCUMENTS

| | | | | |
|---|---|---|---|---|
| KR | 20120011232 A | 2/2012 | | |
| KR | 20150120400 A | 10/2015 | | |
| WO | WO-2014130670 A1 * | 8/2014 | | C23C 16/455 |

\* cited by examiner

CONTOUR POCKET AND HYBRID SUSCEPTOR FOR WAFER UNIFORMITY

CROSS-REFERENCE TO RELATED APPLICATIONS

This application is a Divisional application of U.S. patent application Ser. No. 15/616,364, Jun. 7, 2017, which claims priority to U.S. Provisional Application No. 62/347,062, filed Jun. 7, 2016, the entire disclosure of which is hereby incorporated by reference herein.

TECHNICAL FIELD

The present disclosure relates generally to pockets to support wafers in a susceptor. In particular, embodiments of the disclosure are directed to susceptor assemblies with wafer pockets for batch processing chambers.

BACKGROUND

In a batch processing chamber, film thickness, refractive index and wet etch rate uniformity are mostly dependent on pocket temperature variations in the radial and azimuthal directions. Some deposited films, like SiN, are very sensitive to thermal gradients and uniformity inside the pocket in both directions. Thermal non-uniformity is more predominant than RF non-uniformity on most films. Some current batch process chambers using carousel susceptors with one slit valve, five zone heater coils are not enough to compensate for large thermal gradients (>10° C.) on the wafer even with zonal tuning and susceptor rotation. This may be due, in part, to cold spots near the slit valve and lift pins.

Current SiC coated graphite susceptors are large, monolithic and expensive to clean. In order to get the susceptor cleaned, a spare susceptor is kept to minimize chamber downtime. Whenever a new susceptor is installed, the flatness, runout and other measurements are documents. SiC coated materials are resistance to aqueous solutions of salts, organic reagents, some dilute acids (e.g., dilute HF, HCl, $H_2SO_4$, $HNO_3$) and hot inert gases. However, the SiC coating by itself is not inert and erodes faster under $NF_3$ plasma or fluorine, HF environments.

Therefore, there is a need in the art for apparatus and methods to increase temperature uniformity across the wafer. There is also a need in the art for susceptors inert to the chamber environment.

SUMMARY

One or more embodiments of the disclosure are directed to susceptor assemblies comprising a susceptor base, a plurality of pie-shaped skins and a pie anchor. The plurality of pie-shaped skins is on the susceptor base. The pie anchor is in a center of the susceptor base and is configured to cooperatively interact with the pie-shaped skins to hold the pie-shaped skins in place.

Additional embodiments of the disclosure are directed to susceptor assemblies comprising a susceptor base with a plurality of islands extending above the susceptor base. The islands are sized to support a substrate during processing. A plurality of skins are positioned to surround the plurality of islands, each of the plurality of skins made from a ceramic material.

Further embodiments of the disclosure are directed to susceptor assemblies comprising a susceptor base with a plurality of recesses with pocket covers within the recesses. The pocket covers have a thickness substantially the same as the depth of the recesses. A plurality of pie-shaped skins is on the susceptor base. Each of the pie-shaped skins has at least one recess or protrusion adjacent an inner peripheral edge of the pie-shaped skin. A pie anchor is in a center of the susceptor base. The pie anchor is configured to cooperatively interact with the pie-shaped skins to hold the pie-shaped skins in place. The pie anchor comprises at least one protrusion sized to cooperatively interact with the at least one recess or at least one recess sized to cooperatively interact with the at least one protrusion on the pie-shaped skins. A clamp plate is positioned over the anchor and inner peripheral edge of the skins.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface.

Figure 1:
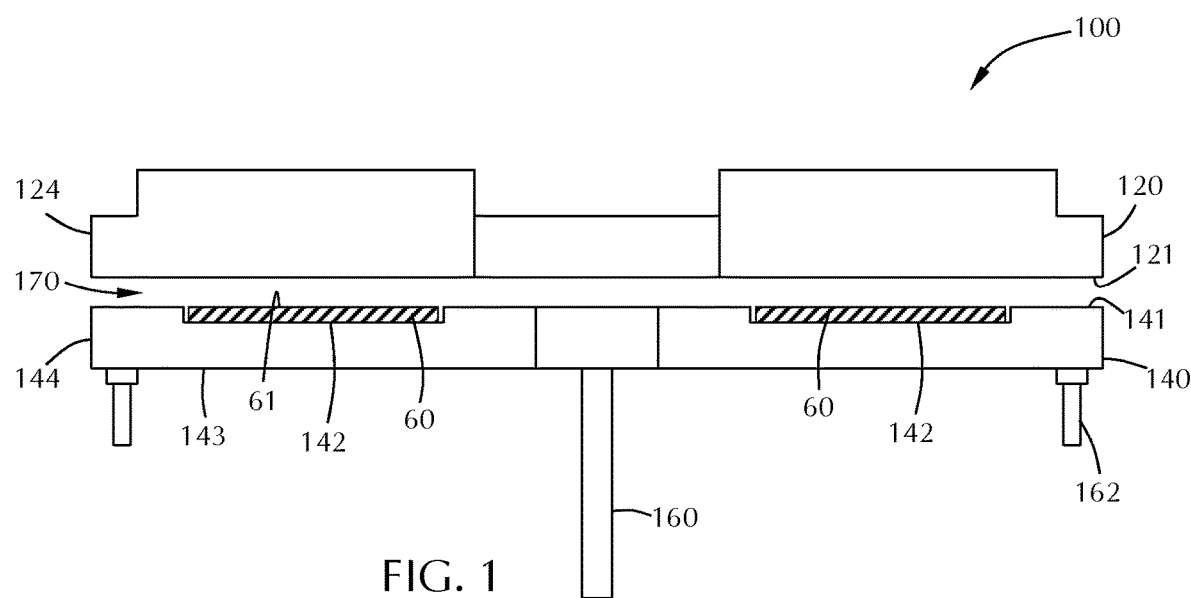
FIG. 1 shows a cross-sectional view of a batch processing chamber in accordance with one or more embodiment of the disclosure.

FIG. 1 shows a cross-section of a processing chamber 100 including a gas distribution assembly 120, also referred to as injectors or an injector assembly, and a susceptor assembly 140. The gas distribution assembly 120 is any type of gas delivery device used in a processing chamber. The gas distribution assembly 120 includes a front surface 121 which faces the susceptor assembly 140. The front surface 121 can have any number or variety of openings to deliver a flow of gases toward the susceptor assembly 140. The gas distribution assembly 120 also includes an outer peripheral edge 124 which in the embodiments shown, is substantially round.

The specific type of gas distribution assembly 120 used can vary depending on the particular process being used. Embodiments of the disclosure can be used with any type of processing system where the gap between the susceptor and the gas distribution assembly is controlled. While various types of gas distribution assemblies can be employed (e.g., showerheads), embodiments of the disclosure may be particularly useful with spatial gas distribution assemblies which have a plurality of substantially parallel gas channels. As used in this specification and the appended claims, the term "substantially parallel" means that the elongate axis of the gas channels extend in the same general direction. There can be slight imperfections in the parallelism of the gas channels. In a binary reaction, the plurality of substantially parallel gas channels can include at least one first reactive gas A channel, at least one second reactive gas B channel, at least one purge gas P channel and/or at least one vacuum V channel. The gases flowing from the first reactive gas A channel(s), the second reactive gas B channel(s) and the purge gas P channel(s) are directed toward the top surface of the wafer. Some of the gas flow moves horizontally across the surface of the wafer and out of the process region through the purge gas P channel(s). A substrate moving from one end of the gas distribution assembly to the other end will be exposed to each of the process gases in turn, forming a layer on the substrate surface.

Figure 2:
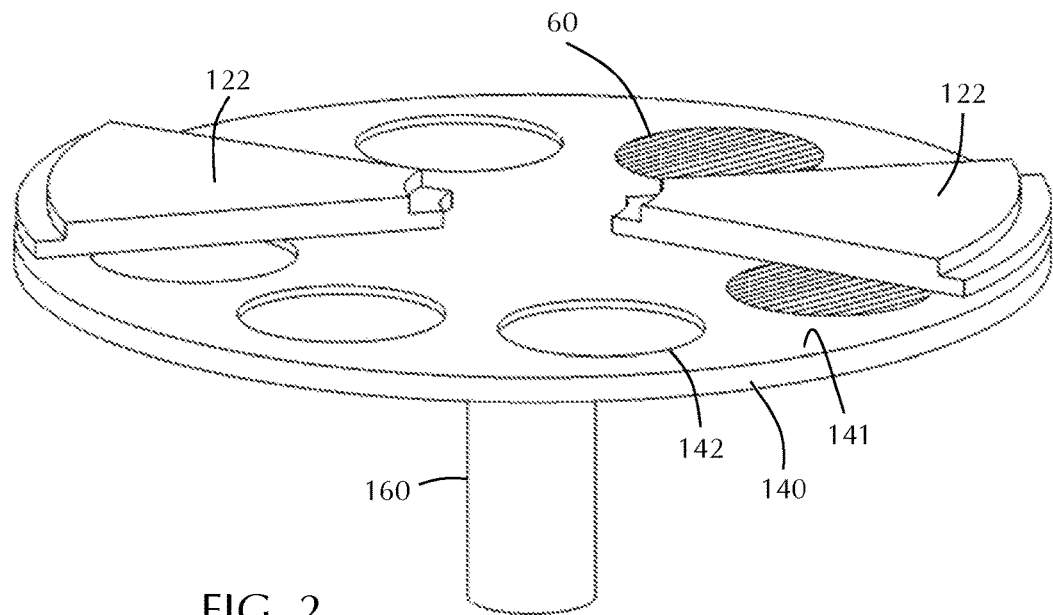
FIG. 2 shows a partial perspective view of a batch processing chamber in accordance with one or more embodiment of the disclosure.

In some embodiments, the gas distribution assembly 120 is a rigid stationary body made of a single injector unit. In one or more embodiments, the gas distribution assembly 120 is made up of a plurality of individual sectors (e.g., injector units 122), as shown in FIG. 2. Either a single piece body or a multi-sector body can be used with the various embodiments of the disclosure described.

A susceptor assembly 140 is positioned beneath the gas distribution assembly 120. The susceptor assembly 140 includes a top surface 141 and at least one recess 142 in the top surface 141. The susceptor assembly 140 also has a bottom surface 143 and an edge 144. The recess 142 can be any suitable shape and size depending on the shape and size of the substrates 60 being processed. In the embodiment shown in FIG. 1, the at least one recess 142 has a flat bottom to support the bottom of the wafer; however, the bottom of the recess can vary. In some embodiments, the recess has step regions around the outer peripheral edge of the recess which are sized to support the outer peripheral edge of the wafer. The amount of the outer peripheral edge of the wafer that is supported by the steps can vary depending on, for example, the thickness of the wafer and the presence of features already present on the back side of the wafer.

In some embodiments, as shown in FIG. 1, the recess 142 in the top surface 141 of the susceptor assembly 140 is sized so that a substrate 60 supported in the recess 142 has a top surface 61 substantially coplanar with the top surface 141 of the susceptor 140. As used in this specification and the appended claims, the term "substantially coplanar" means that the top surface of the wafer and the top surface of the susceptor assembly are coplanar within ±0.2 mm. In some embodiments, the top surfaces are coplanar within 0.5 mm, ±0.4 mm, ±0.35 mm, ±0.30 mm, ±0.25 mm, ±0.20 mm, ±0.15 mm, ±0.10 mm or ±0.05 mm.

The susceptor assembly 140 of FIG. 1 includes a support post 160 which is capable of lifting, lowering and rotating the susceptor assembly 140. The susceptor assembly may include a heater, or gas lines, or electrical components within the center of the support post 160. The support post 160 may be the primary means of increasing or decreasing the gap between the susceptor assembly 140 and the gas distribution assembly 120, moving the susceptor assembly 140 into proper position. The susceptor assembly 140 may also include fine tuning actuators 162 which can make micro-adjustments to susceptor assembly 140 to create a predetermined gap 170 between the susceptor assembly 140 and the gas distribution assembly 120.

In some embodiments, the gap 170 distance is in the range of about 0.1 mm to about 5.0 mm, or in the range of about 0.1 mm to about 3.0 mm, or in the range of about 0.1 mm to about 2.0 mm, or in the range of about 0.2 mm to about 1.8 mm, or in the range of about 0.3 mm to about 1.7 mm, or in the range of about 0.4 mm to about 1.6 mm, or in the range of about 0.5 mm to about 1.5 mm, or in the range of about 0.6 mm to about 1.4 mm, or in the range of about 0.7 mm to about 1.3 mm, or in the range of about 0.8 mm to about 1.2 mm, or in the range of about 0.9 mm to about 1.1 mm, or about 1 mm.

The processing chamber 100 shown in the Figures is a carousel-type chamber in which the susceptor assembly 140 can hold a plurality of substrates 60. As shown in FIG. 2, the gas distribution assembly 120 may include a plurality of separate injector units 122, each injector unit 122 being capable of depositing a film on the wafer, as the wafer is moved beneath the injector unit. Two pie-shaped injector units 122 are shown positioned on approximately opposite sides of and above the susceptor assembly 140. This number of injector units 122 is shown for illustrative purposes only. It will be understood that more or less injector units 122 can be included. In some embodiments, there are a sufficient number of pie-shaped injector units 122 to form a shape conforming to the shape of the susceptor assembly 140. In some embodiments, each of the individual pie-shaped injector units 122 may be independently moved, removed and/or replaced without affecting any of the other injector units 122. For example, one segment may be raised to permit a robot to access the region between the susceptor assembly 140 and gas distribution assembly 120 to load/unload substrates 60.

Figure 3:
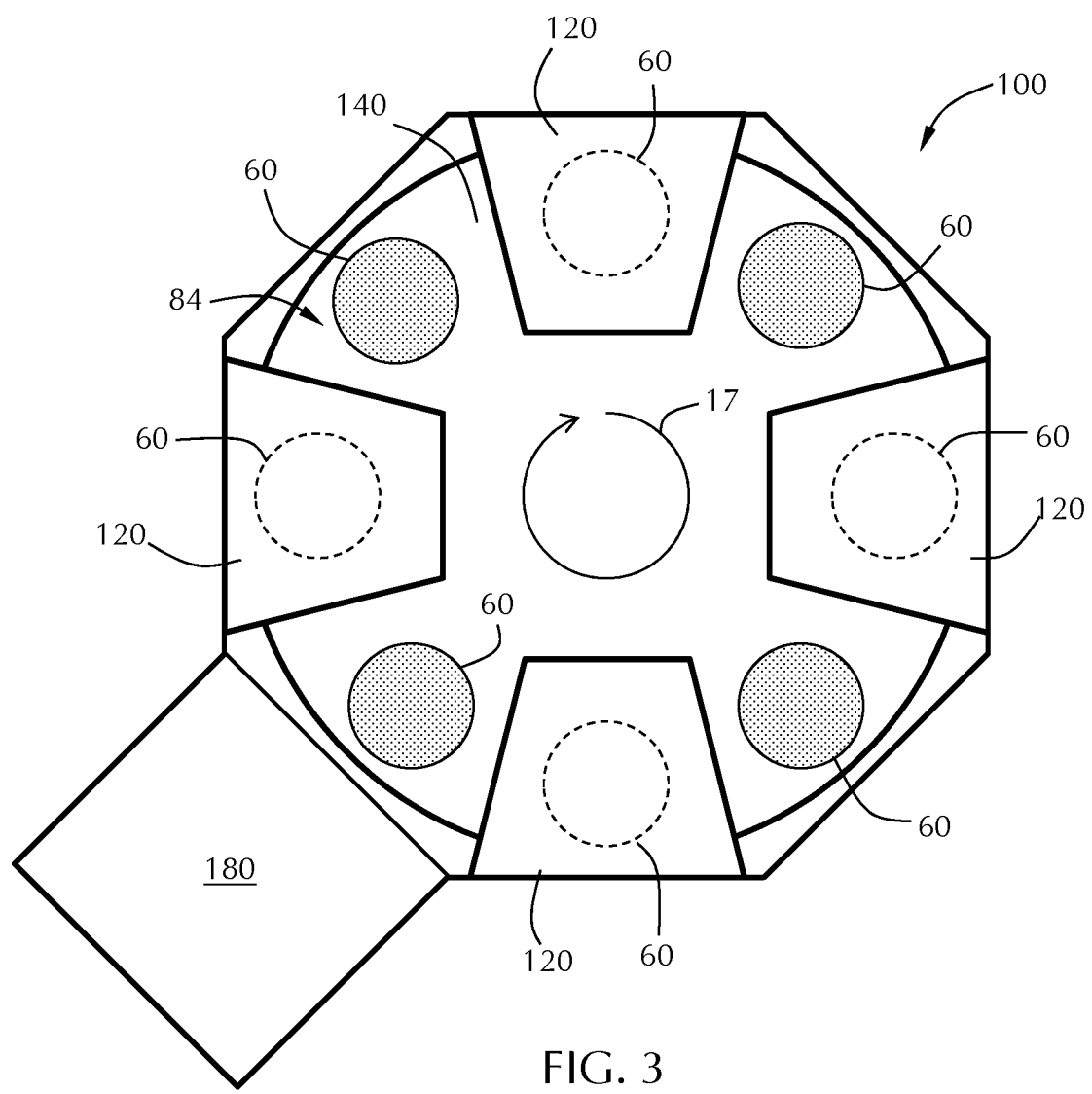
FIG. 3 shows a schematic view of a batch processing chamber in accordance with one or more embodiment of the disclosure.

Processing chambers having multiple gas injectors can be used to process multiple wafers simultaneously so that the wafers experience the same process flow. For example, as shown in FIG. 3, the processing chamber 100 has four gas injector assemblies and four substrates 60. At the outset of processing, the substrates 60 can be positioned between the gas distribution assemblies 120. Rotating 17 the susceptor assembly 140 by 45° will result in each substrate 60 which is between gas distribution assemblies 120 to be moved to an gas distribution assembly 120 for film deposition, as illustrated by the dotted circle under the gas distribution assemblies 120. An additional 45° rotation would move the substrates 60 away from the gas distribution assemblies 120. The number of substrates 60 and gas distribution assemblies 120 can be the same or different. In some embodiments, there are the same numbers of wafers being processed as there are gas distribution assemblies. In one or more embodiments, the number of wafers being processed are fraction of or an integer multiple of the number of gas distribution assemblies. For example, if there are four gas distribution assemblies, there are 4x wafers being processed, where x is an integer value greater than or equal to one. In an exemplary embodiment, the gas distribution assembly 120 includes eight process regions separated by gas curtains and the susceptor assembly 140 can hold six wafers.

The processing chamber 100 shown in FIG. 3 is merely representative of one possible configuration and should not be taken as limiting the scope of the disclosure. Here, the processing chamber 100 includes a plurality of gas distribution assemblies 120. In the embodiment shown, there are four gas distribution assemblies (also called gas distribution assemblies 120) evenly spaced about the processing chamber 100. The processing chamber 100 shown is octagonal; however, those skilled in the art will understand that this is one possible shape and should not be taken as limiting the scope of the disclosure. The gas distribution assemblies 120 shown are trapezoidal, but can be a single circular component or made up of a plurality of pie-shaped segments, like that shown in FIG. 2.

The embodiment shown in FIG. 3 includes a load lock chamber 180, or an auxiliary chamber like a buffer station. This chamber 180 is connected to a side of the processing chamber 100 to allow, for example the substrates (also referred to as substrates 60) to be loaded/unloaded from the processing chamber 100. A wafer robot may be positioned in the chamber 180 to move the substrate onto the susceptor.

Rotation of the carousel (e.g., the susceptor assembly 140) can be continuous or intermittent (discontinuous). In continuous processing, the wafers are constantly rotating so that they are exposed to each of the injectors in turn. In discontinuous processing, the wafers can be moved to the injector region and stopped, and then to the region 84 between the injectors and stopped. For example, the carousel can rotate so that the wafers move from an inter-injector region across the injector (or stop adjacent the injector) and on to the next inter-injector region where the carousel can pause again. Pausing between the injectors may provide time for additional processing steps between each layer deposition (e.g., exposure to plasma).

Figure 4:
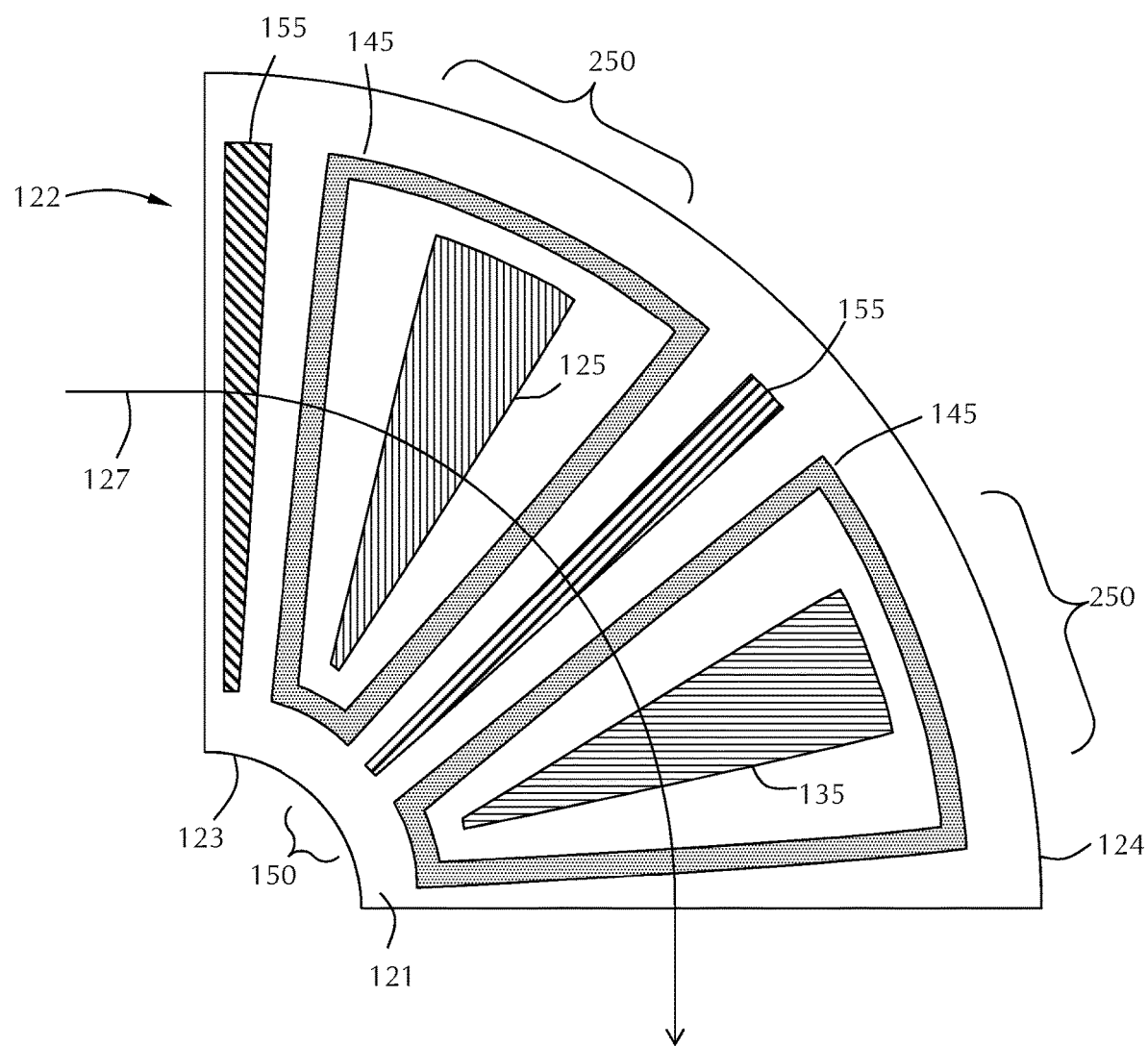
FIG. 4 shows a schematic view of a portion of a wedge shaped gas distribution assembly for use in a batch processing chamber in accordance with one or more embodiment of the disclosure.
Figure 5:
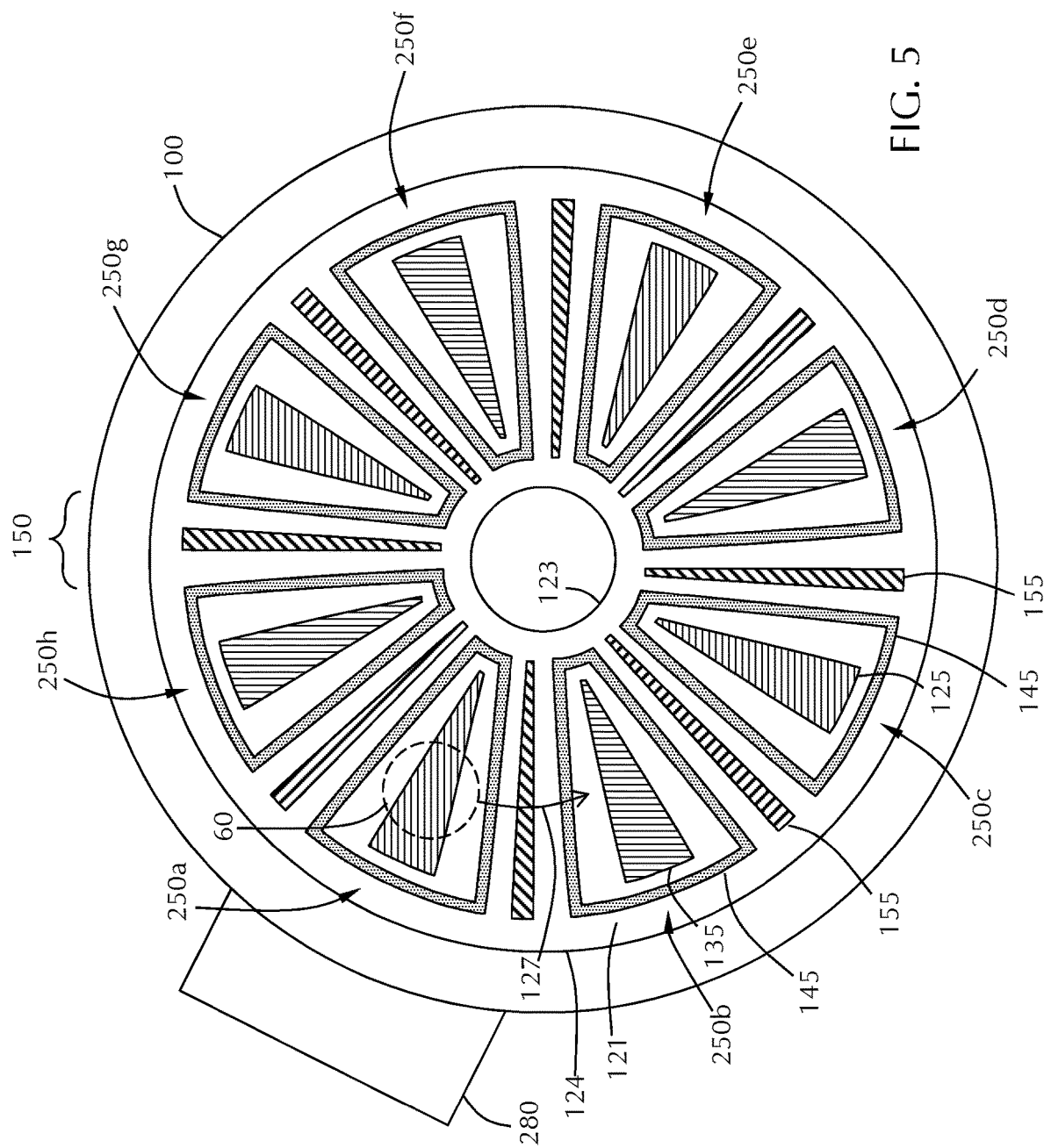
FIG. 5 shows a schematic view of a batch processing chamber in accordance with one or more embodiment of the disclosure.

FIG. 4 shows a sector or portion of a gas distribution assembly 120, which may be referred to as an injector unit 122. The injector units 122 can be used individually or in combination with other injector units. For example, as shown in FIG. 5, four of the injector units 122 of FIG. 4 are combined to form a single gas distribution assembly 120. (The lines separating the four injector units are not shown for clarity.) While the injector unit 122 of FIG. 4 has both a first reactive gas port 125 and a second gas port 135 in addition to purge gas ports 155 and vacuum ports 145, an injector unit 122 does not need all of these components.

Referring to both FIGS. 4 and 5, a gas distribution assembly 120 in accordance with one or more embodiment may comprise a plurality of sectors (or injector units 122) with each sector being identical or different. The gas distribution assembly 120 is positioned within the processing chamber and comprises a plurality of elongate gas ports 125, 135, 155 and vacuum ports 145 in a front surface 121 of the gas distribution assembly 120. The plurality of elongate gas ports 125, 135, 155 and vacuum ports 145 extend from an area adjacent the inner peripheral edge 123 toward an area adjacent the outer peripheral edge 124 of the gas distribution assembly 120. The plurality of gas ports shown include a first reactive gas port 125, a second gas port 135, a vacuum port 145 which surrounds each of the first reactive gas ports and the second reactive gas ports and a purge gas port 155.

With reference to the embodiments shown in FIG. 4 or 5, when stating that the ports extend from at least about an inner peripheral region to at least about an outer peripheral region, however, the ports can extend more than just radially from inner to outer regions. The ports can extend tangentially as vacuum port 145 surrounds reactive gas port 125 and reactive gas port 135. In the embodiment shown in FIGS. 4 and 5, the wedge shaped reactive gas ports 125, 135 are surrounded on all edges, including adjacent the inner peripheral region and outer peripheral region, by a vacuum port 145.

Referring to FIG. 4, as a substrate moves along path 127, each portion of the substrate surface is exposed to the various reactive gases. To follow the path 127, the substrate will be exposed to, or "see", a purge gas port 155, a vacuum port 145, a first reactive gas port 125, a vacuum port 145, a purge gas port 155, a vacuum port 145, a second gas port 135 and a vacuum port 145. Thus, at the end of the path 127 shown in FIG. 4, the substrate has been exposed to the first reactive gas from a first reactive gas port 125 and the second reactive gas from the second reactive gas port 135 to form a layer. The injector unit 122 shown makes a quarter circle but could be larger or smaller. The gas distribution assembly 120 shown in FIG. 5 can be considered a combination of four of the injector units 122 of FIG. 4 connected in series.

The injector unit 122 of FIG. 4 shows a gas curtain 150 that separates the reactive gases. The term "gas curtain" is used to describe any combination of gas flows or vacuum that separate reactive gases from mixing. The gas curtain 150 shown in FIG. 4 comprises the portion of the vacuum port 145 next to the first reactive gas port 125, the purge gas port 155 in the middle and a portion of the vacuum port 145 next to the second gas port 135. This combination of gas flow and vacuum can be used to prevent or minimize gas phase reactions of the first reactive gas and the second reactive gas.

Referring to FIG. 5, the combination of gas flows and vacuum from the gas distribution assembly 120 form a separation into a plurality of process regions 250. The process regions are roughly defined around the individual gas ports 125, 135 with the gas curtain 150 between 250. The embodiment shown in FIG. 5 makes up eight separate process regions 250 with eight separate gas curtains 150 between. A processing chamber can have at least two process region. In some embodiments, there are at least three, four, five, six, seven, eight, nine, 10, 11 or 12 process regions.

During processing a substrate may be exposed to more than one process region 250 at any given time. However, the portions that are exposed to the different process regions will have a gas curtain separating the two. For example, if the leading edge of a substrate enters a process region including the second gas port 135, a middle portion of the substrate will be under a gas curtain 150 and the trailing edge of the substrate will be in a process region including the first reactive gas port 125.

A factory interface 280, which can be, for example, a load lock chamber, is shown connected to the processing chamber 100. A substrate 60 is shown superimposed over the gas distribution assembly 120 to provide a frame of reference. The substrate 60 may often sit on a susceptor assembly to be held near the front surface 121 of the gas distribution plate 120. The substrate 60 is loaded via the factory interface 280 into the processing chamber 100 onto a substrate support or susceptor assembly (see FIG. 3). The substrate 60 can be shown positioned within a process region because the substrate is located adjacent the first reactive gas port 125 and between two gas curtains 150. Rotating the substrate 60 along path 127 will move the substrate counter-clockwise around the processing chamber 100. Thus, the substrate 60 will be exposed to the first process region 250a through the eighth process region 250h, including all process regions between.

Embodiments of the disclosure are directed to processing methods comprising a processing chamber 100 with a plurality of process regions 250a-250h with each process region separated from an adjacent region by a gas curtain 150. For example, the processing chamber shown in FIG. 5. The number of gas curtains and process regions within the processing chamber can be any suitable number depending on the arrangement of gas flows. The embodiment shown in FIG. 5 has eight gas curtains 150 and eight process regions 250a-250h.

A plurality of substrates 60 are positioned on a substrate support, for example, the susceptor assembly 140 shown in FIGS. 1 and 2. The plurality of substrates 60 are rotated around the process regions for processing. Generally, the gas curtains 150 are engaged (gas flowing and vacuum on) throughout processing including periods when no reactive gas is flowing into the chamber.

Wafer temperature mapping can be deduced based on growth per cycle. Current batch processing chamber pockets have thinner SiN/SAC films at the center 3" diameter because of a deeper valley in the center. The full wafer contact at 12 mm wide outer diameter seal band shows a thicker film at the wafer outer diameter. This translates into colder wafer centers and thick wafer edges. Similar phenomena have been observed at the lift pin seal bands positioned at varying degrees. Thermal modeling has shown similar trends from thermal conductivity variations. The valley depth and full contact areas of the wafer can be used as knobs to mitigate or enhance temperature profiles for different applications, like dielectric, metal or structure wafers. On structure wafers, thicker films occur near the loading areas. Some embodiments of the disclosure advantageously mitigate temperature non-uniformity by using lower thermal conductive materials like alumina or quartz at strategic places where hot spots are observed.

Some embodiments advantageously provide reduced thickness variation by providing a contoured pocket design which has an inner diameter and outer diameter full contact. In some embodiments, the pocket design is advantageously deep trenches on the outer diameters of the pocket. One or more embodiments advantageously provide alumina rings to drop wafer edge temperatures.

One or more embodiments advantageously provide thin pie-shaped skins on top of SiC-graphite substrate to keep the flat and parallel for performance and longevity. In some embodiments, the hybrid susceptor provides easily replaceable 60° pies for fast and inexpensive recycling. In some embodiments, pies are made from materials including aluminum, AlN, SiC, and materials that can be used for inertness to $NF_3$, chlorine and $O_2/O_3$ attacks from in-situ plasma. Some embodiments provide secondary coatings (HPM®, Durablock®, Duracoat®, yttria, AsMy, etc.) that can be used on the pie for increased resistance to erosive chemicals. In one or more embodiments, multiple base materials (e.g., pure graphite, SiC coated graphite, stainless steel, aluminum) are employed. In some embodiments, the base can be made of stainless steel/aluminum/graphite bolted/welded frames. In some embodiments, the pie shaped skins are made out of flat SiC-graphite for faster cleaning cycles. In some embodiments, the pie shaped skins can deliver vacuum or other inert gases to the wafer pockets with chucking and purge capabilities. In one or more embodiments, the wafer thermal and film thickness uniformity is increased with pie shaped quartz skins that can be placed on areas between the pockets. In some embodiments, alumina or quartz rings can be placed inside the pockets for thermal and film-thickness uniformity improvement.

Figure 6:
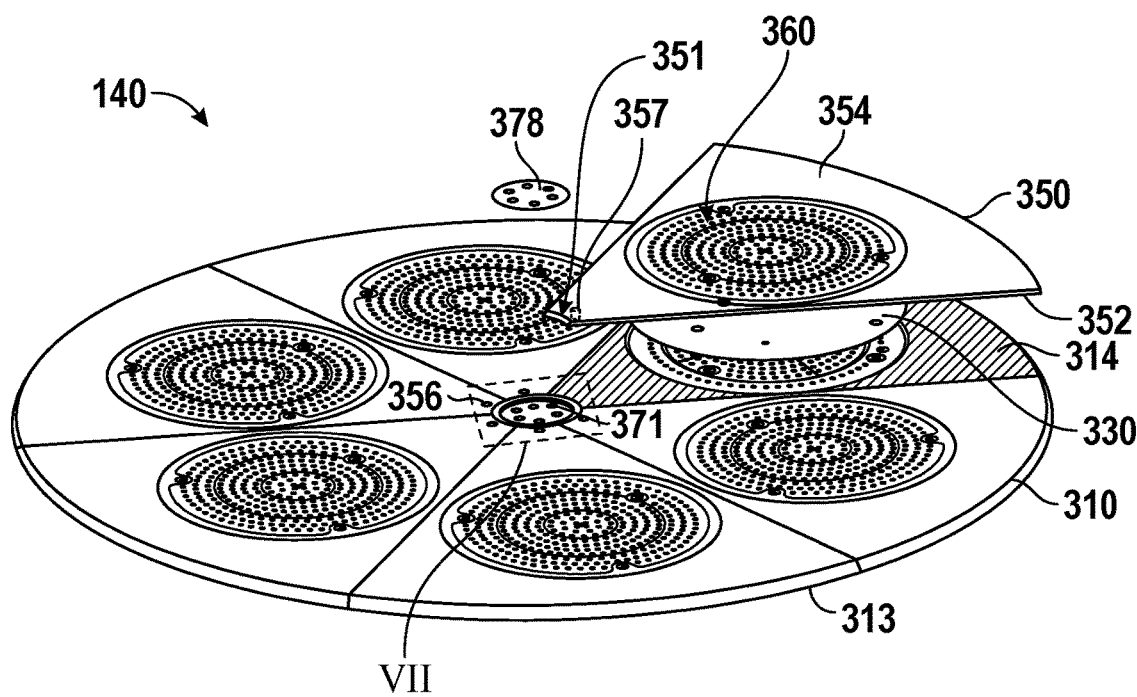
FIG. 6 shows a susceptor assembly in accordance with one or more embodiment of the disclosure.

FIG. 6 shows an embodiment of a susceptor assembly 140 in accordance with one or more embodiment of the disclosure. The susceptor assembly 140 shown is configured to carry six wafers during processing. The susceptor assembly 140 can incorporate wafer chucking capabilities and/or grounding capabilities for plasma processes.

Monolithic aluminum susceptors have been observed to droop at 400° C., which is the annealing temperature of the material base. The aluminum susceptor base may be supported at the center with no support at the outer diameter. Stresses built from thermal non-uniformity, the weight of the susceptor itself and/or rotation can cause the drooping to occur over time. Therefore, some embodiments incorporate a graphite base to minimize or eliminate drooping and minimize stress on the susceptor base.

The susceptor assembly 140 embodiment shown in FIG. 6 includes a susceptor base 310, an optional pocket cover 330, a pie skin 350 and a pie anchor 370. The susceptor base 310 can be made from any suitable material including, but not limited to, graphite. The thickness of the susceptor base 310 can be in the range of about 10 mm to about 50 mm, or in the range of about 20 mm to about 40 mm. In some embodiments, the susceptor base 310 is about 30 mm thick. The thickness of the susceptor base 310 is measured as the distance between the bottom surface 313 and the top surface 314.

The pie skin 350 can cover a portion of the susceptor base 310 so that a plurality of pie skins 350 can be arranged to cover the susceptor base 310. In the embodiment shown there are six pie skins 350 arranged to form a circular component covering the susceptor base 310. The angle of the pie skins 350 can vary depending on, for example, the number of skins used to cover the base. For example, each of the pie skins 350 in FIG. 6 has an angle of about 60°. In some embodiments, there are in the range of about 2 to about 24 pie skins 350, or in the range of about 3 to about 12 pie skins, or in the range of about 4 to about 8 pie skins. In some embodiments, there are 3, 4 or 6 pie skins 350.

The pie skins can be made from any suitable material. Suitable materials may be corrosion resistance including, but not limited to, aluminum, aluminum nitride, aluminum oxide, nitride or oxide coated materials.

The thickness of the skin 350, measured from the bottom surface 352 to the top surface 354 is generally small relative to the thickness of the base 310. In some embodiments, the pie skin 350 is in the range of about 2 mm to about 12 mm thick, or in the range of about 3 mm to about 10 mm thick. In some embodiments, the pie skin 350 is about 6 mm thick. In one or more embodiments, the pie skin 350 has a thickness greater than about 3 mm, 4 mm, 5 mm, 6 mm, 7 mm or 8 mm. The thickness of the susceptor assembly 140 can be measured as the combined thickness of the susceptor base 310 and the pie skin 350. The thickness of the susceptor assembly of some embodiments is in the range of about 20 mm to about 60 mm, or in the range of about 25 mm to about 50 mm, or in the range of about 30 mm to about 40 mm, or about 33 mm to about 37 mm.

The pie skin 350 can include a pocket 360 sized to support a wafer during processing. The pocket 360 of some embodiments has a depth in the range of about 2 mm to about 12 mm, or in the range of about 3 mm to about 11 mm, or in the 4 mm to about 10 mm, or in the range of about 6 mm to about 8 mm. In some embodiments, the pocket 360 is about 8 mm deep.

Figure 7:
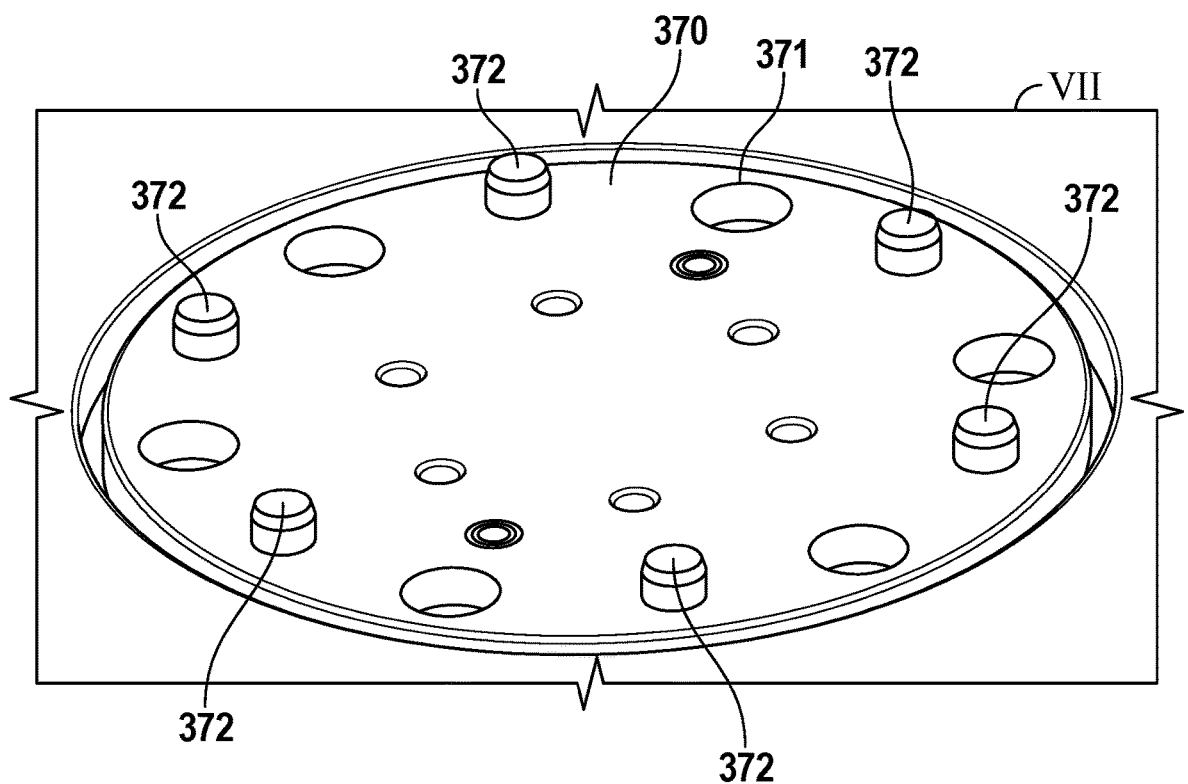
FIG. 7 shows an anchor in a susceptor assembly in accordance with one or more embodiment of the disclosure.

The pie skin 350 can be held in place by friction or some suitable mechanical connection. In some embodiments, as shown in FIGS. 6 and 7, the pie skin 350 is held in place using a pie anchor 370 with a pie anchor pin 372. The anchor pin 372 can be a protrusion in the pie anchor 370 that cooperatively interacts with a pie recess 356 in the skin 350. The pie anchor 370 shown in FIG. 7 has six anchor pins 372 to hold six skins 350 at the same time. While the embodiments shown have a protrusion on the anchor and a recess in the skin, those skilled in the art will understand that these are merely exemplary and should not be taken as limiting the scope of the disclosure. In some embodiments, the pie anchor 372 has a recess 371 that cooperatively interacts with a protrusion 357 on the skin 350 (e.g., on the bottom of the skin 350). The number of protrusions 357 for each pie skin 350 can vary.

Figure 9:
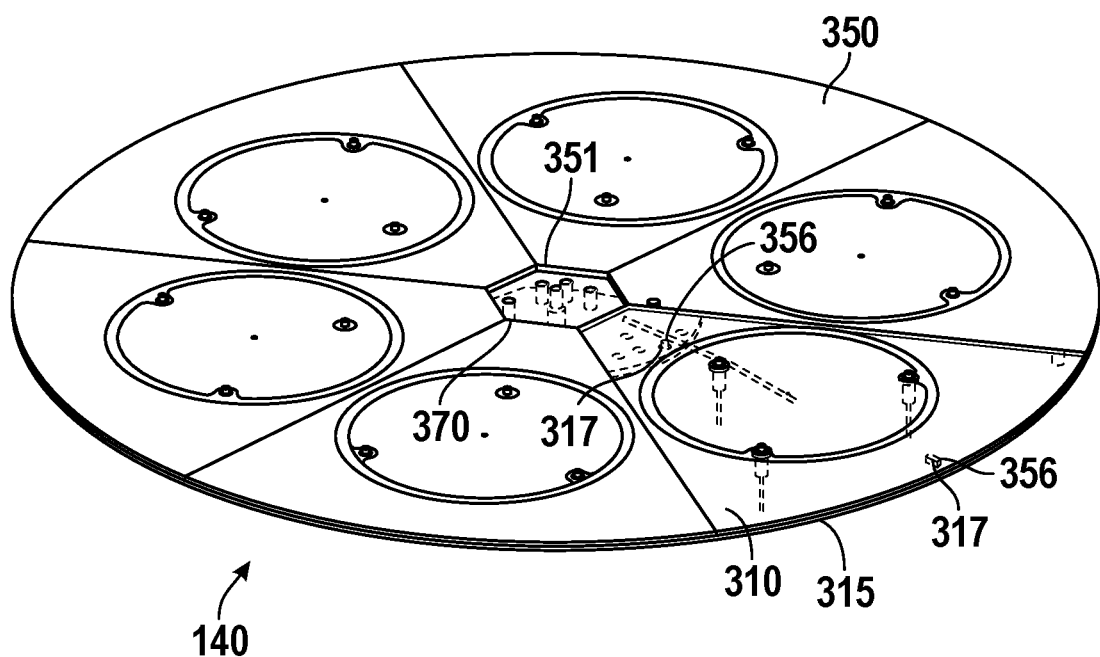
FIG. 9 shows a susceptor assembly in accordance with one or more embodiment of the disclosure.

In the embodiment shown in FIG. 6, there is only one protrusion extending from the pie anchor 370. In some embodiments, there is more than one protrusion extending from the pie anchor 370. In one or more embodiments, there is at least one protrusion extending from the pie anchor and at least one protrusion extending from the base 310 near an outer peripheral edge of the base 310 so that each pie skin 350 is held in place by at least one protrusion near the inner peripheral edge and at least one protrusion near the outer peripheral edge. FIG. 9 shows an alignment pin (protrusion 317) near the outer peripheral edge 315 of the base 310.

The shape of the pie anchor 370 can vary. In the embodiment shown in FIGS. 6 and 7, the pie anchor 370 is round and has a shape that cooperatively interacts with, or matches, the shape of the inner peripheral edge 351 of the skin 350. The embodiment shown in FIG. 9 has a hexagonal pie anchor 370 and the skins 350 have a flat inner peripheral edge 351.

Figure 8:
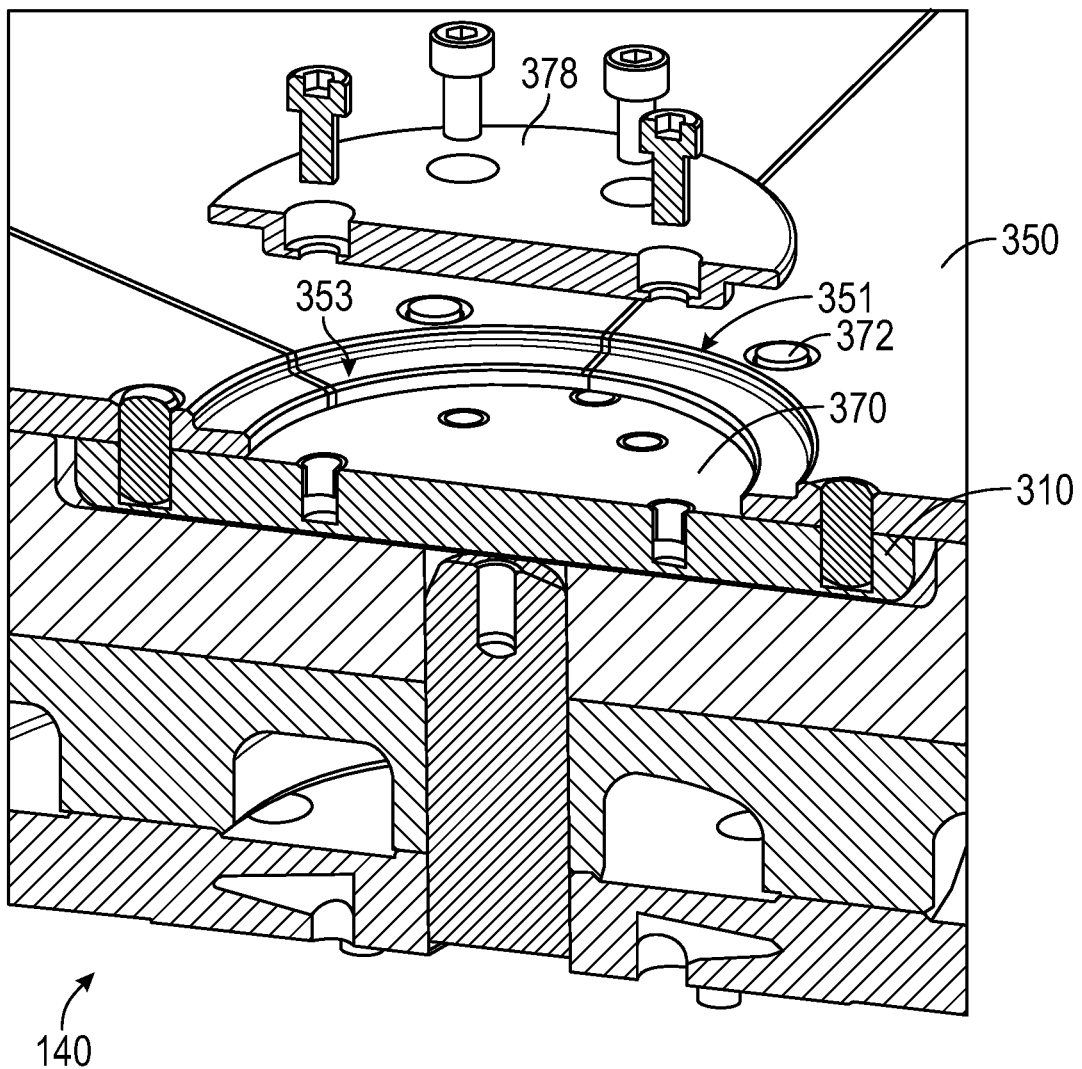
FIG. 8 shows a susceptor assembly in accordance with one or more embodiment of the disclosure.

FIG. 8 shows an embodiment of a susceptor assembly 140 with a plurality of pie skins 350 having a radiused inner peripheral edge 351 with a ledge 353. A clamp plate 378 can be connected to the susceptor base 310 to clamp the pie skins 350 in place by pressing on the ledges 353 of the skins 350. The clamp plate 378 can be bolted to a pin (e.g., a stainless steel pin or sleeve) that extends into the susceptor base 310.

Figure 10:
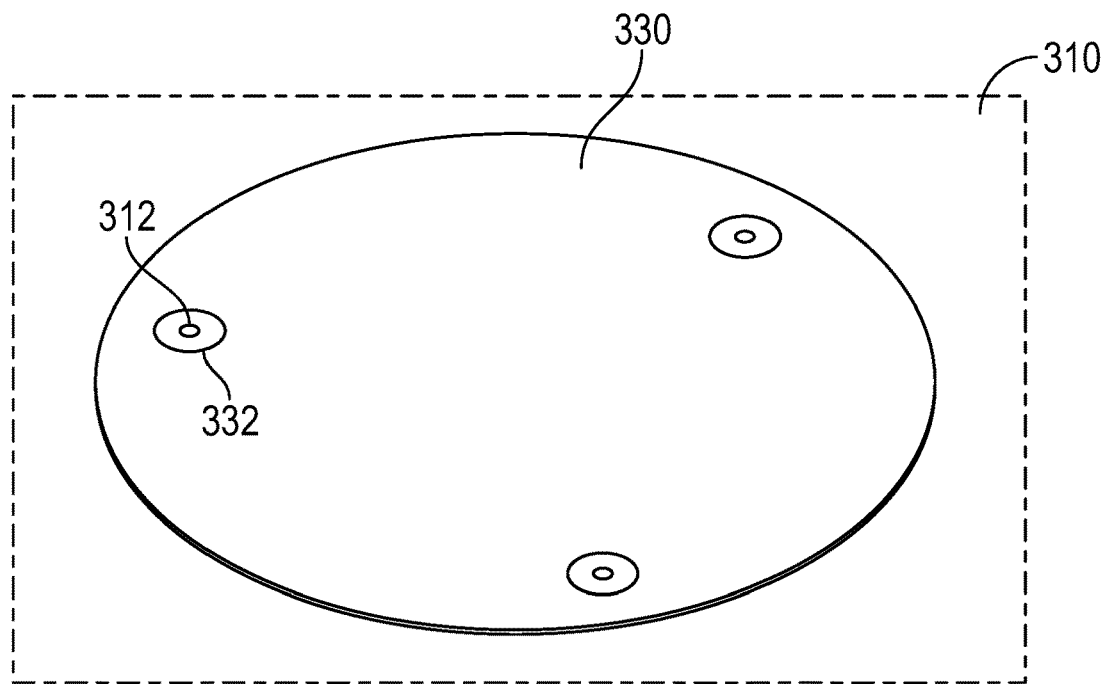
FIG. 10 shows a pocket cover for a susceptor assembly in accordance with one or more embodiment of the disclosure.

In use, the temperature in the processing chamber will cause expansion of the skin 350 and the pocket cover 330. FIG. 10 shows a partial view of a susceptor base 310 with a pocket cover 330 in the recess of the susceptor base 310. The pocket cover 330 has three slots 332 positioned adjacent the lift pins 312 to allow the lift pins 312 to pass through the slots 332. The slots are elongated in the direction of expansion so that upon heating and expansion of the pocket cover 330, the slots 332 do not interfere with movement of the lift pins 312.

The pocket cover 330 may be used to fill the pocket in the base 310, if there is one present. For example, an existing susceptor assembly may have a plurality of pockets formed in the base and the pocket covers 330 may provide a flat surface to support the pie skins 350.

Figure 11:
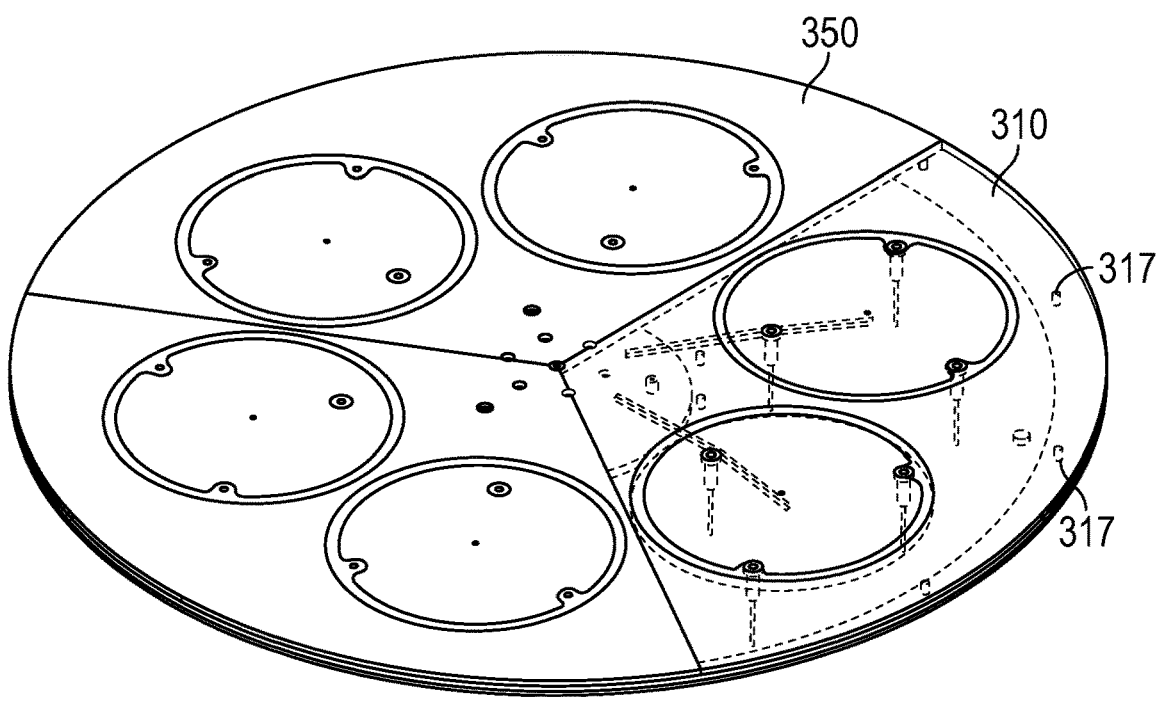
FIG. 11 shows a susceptor assembly in accordance with one or more embodiment of the disclosure.

In some embodiments, as shown in FIG. 11, the susceptor assembly 140 includes three pie skins 350. Each of the pie skins 350 has an angle of about 120°. The smaller number of pie skins in FIG. 11 may be useful to minimize the penetration of gas to the base 310 through a smaller number of seams than that of FIG. 9. Each pie skin 350 can interact with at least two alignment pins 317 near the outer peripheral edge or the inner peripheral edge of the pie skin 350.

Figure 12:
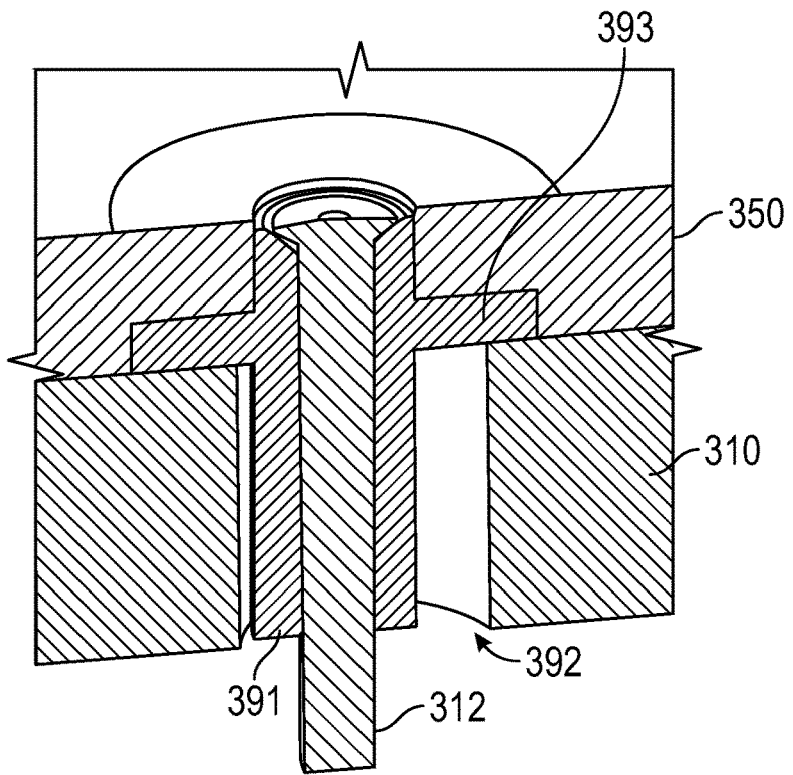
FIG. 12 shows a lift pin for use with a susceptor assembly in accordance with one or more embodiment of the disclosure.

FIG. 12 shows lift pins 312 incorporated into a ceramic sleeve 391 positioned within a radial slot 392 in the base 310. The sleeve 391 shown has a t-shaped body with arms 393 that can be sandwiched between the base 310 and the pie skin 350.

Figure 13:
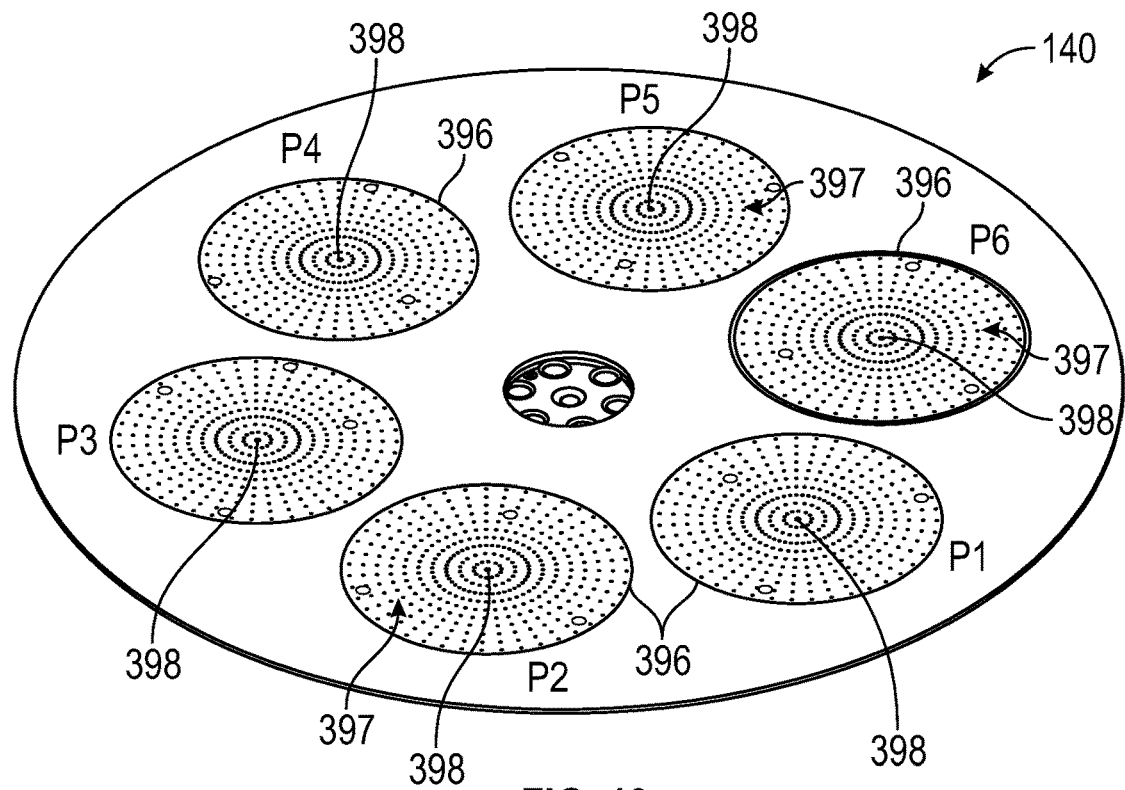
FIG. 13 shows a susceptor assembly in accordance with one or more embodiment of the disclosure.

In some embodiments, as shown in FIG. 13, the susceptor assembly 140 has no pockets in the stop surface. FIG. 13 shows a single component top to the susceptor assembly; however, those skilled in the art will understand that the top can be made up of a plurality of skins 350 as described herein. The single component susceptor is shown for ease of illustration and description only and should not be taken as limiting the scope of the disclosure.

Each of the pockets shown in FIG. 13 can have different characteristics. For example, pockets P1, P2 and P3 have a 5.5 mm outer diameter ledge 396, a flat interior 397 with a center chuck 398. Pockets P4 and P5 have a 12.5 mm outer diameter ledge 396, a flat interior 397 with a 10 mm offset chuck 398. Pocket P6 has a 12.5 mm outer diameter ledge 396, a flat interior 397 and a 25 mm offset chuck 398. The chuck 398 forms a fluid connection to a vacuum source and optionally a purge gas source. The vacuum source can be used to chuck the wafer so that there is little or no movement during processing. The optional purge gas source can be used for a back side purge or to release a chucked wafer by applying backside pressure.

Figure 14:
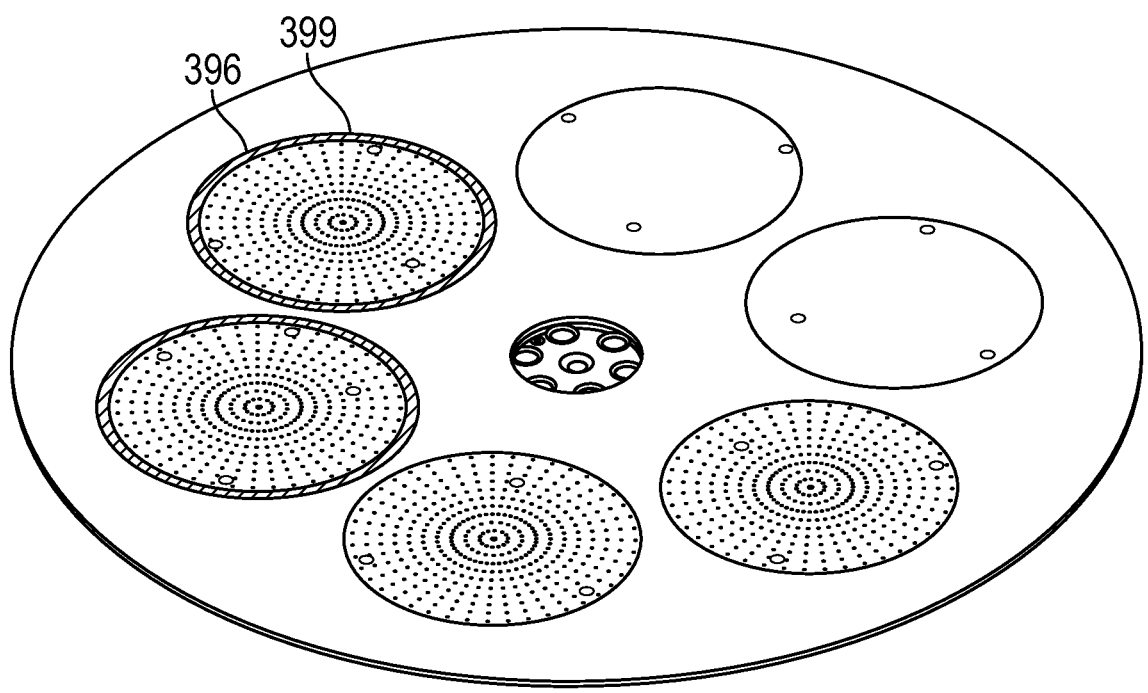
FIG. 14 shows a susceptor assembly in accordance with one or more embodiment of the disclosure.

FIG. 14 shows a susceptor recess with a ledge 396 with a ring 399. The ring 399 can be made from any suitable material including, but not limited to, alumina, quarts, graphite, silicon carbide and SiC-graphite. The use of an edge ring 399 may allow for tuning of the thickness and/or properties of the edge ring by using different materials, thicknesses, contact area, roughness, etc. The edge ring 399 may provide an easily replaceable or serviceable component.

Figure 15:
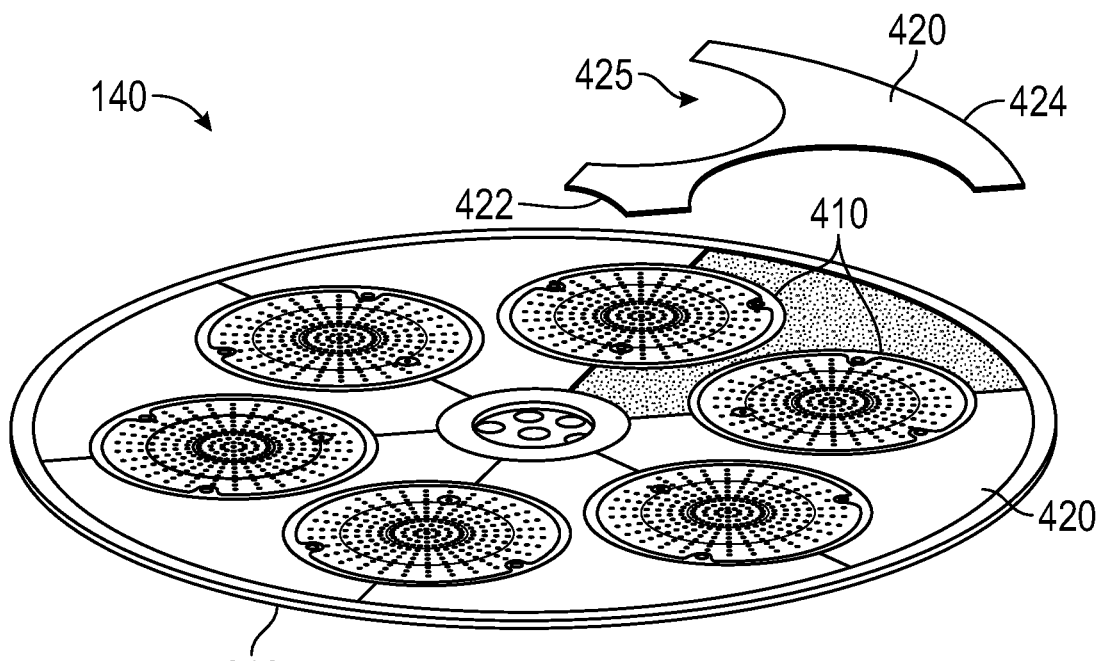
FIG. 15 shows a susceptor assembly in accordance with one or more embodiment of the disclosure.
Figure 16:
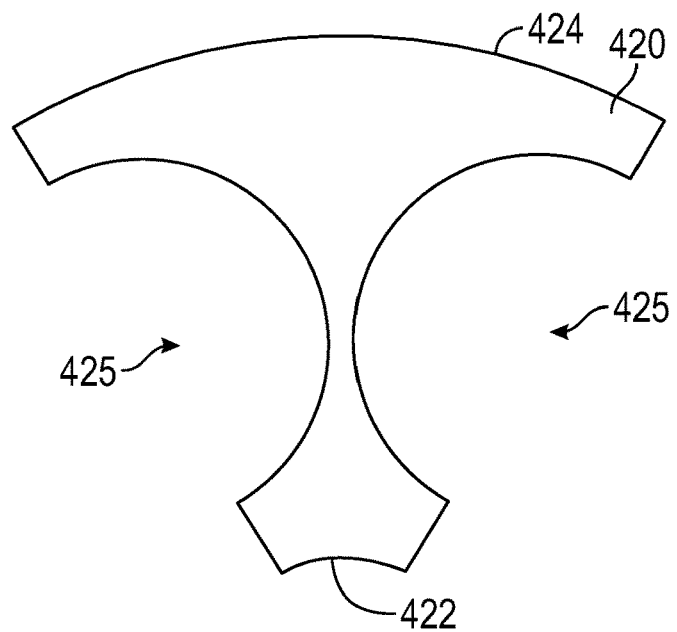
FIG. 16 shows a skin for use with the embodiment of FIG. 15.

FIG. 15 shows another embodiment in which a susceptor base 310 has a plurality of islands 410 which will serve to support a wafer during processing. The islands can have any suitable height. In some embodiments, the islands 410 have a height in the range of about 2 mm to about 5 mm, or about 3 mm.

A plurality of skins 420 are positioned between and surrounding the islands 410. The skins 420 have an inner peripheral edge 422 and an outer peripheral edge 424 and a thickness. At least one cutout 425 in the skin 420 is sized to surround the island 410. Each skin has a thickness in the range of about 2 mm to about 10 mm. In some embodiments, the thickness of the skin 420 is about 3 mm. In one or more embodiments, the skin 420 has a thickness that is substantially the same as the height of the islands 410. In some embodiments, the thickness of the skin 420 is greater than the height of the island 410 so that a recess is formed when the skin 420 is positioned to surround the islands 410. In some embodiments, the thickness of the skin 420 is greater than the height of the island 410 by an amount substantially the same as the thickness of the wafer being processed.

Figure 17:
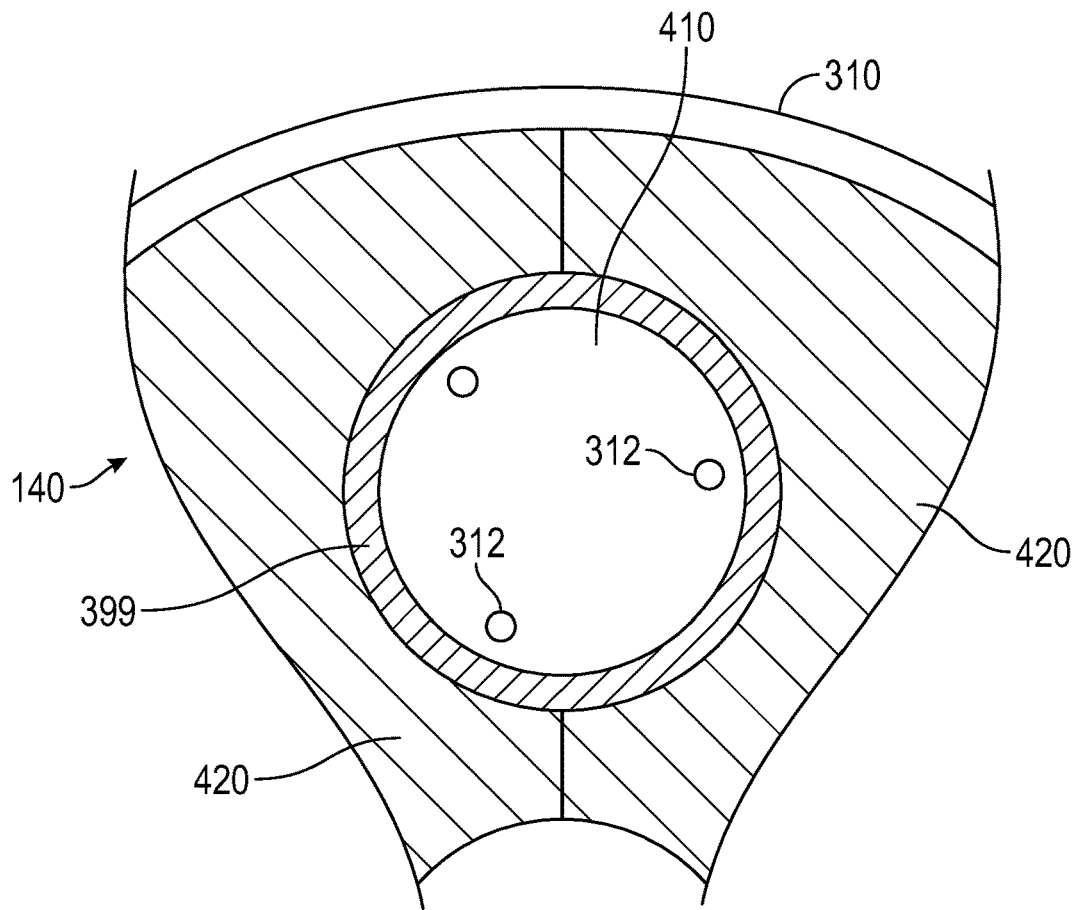
FIG. 17 shows a susceptor assembly in accordance with one or more embodiment of the disclosure.

FIG. 17 shows another embodiment of a susceptor assembly 140 combining the islands 410 with skin 420 and the ring 399. In some embodiments, the susceptor base 310 is graphite, the ring 399 is quartz or alumina and the skin 420 is quartz.

Figure 18A:
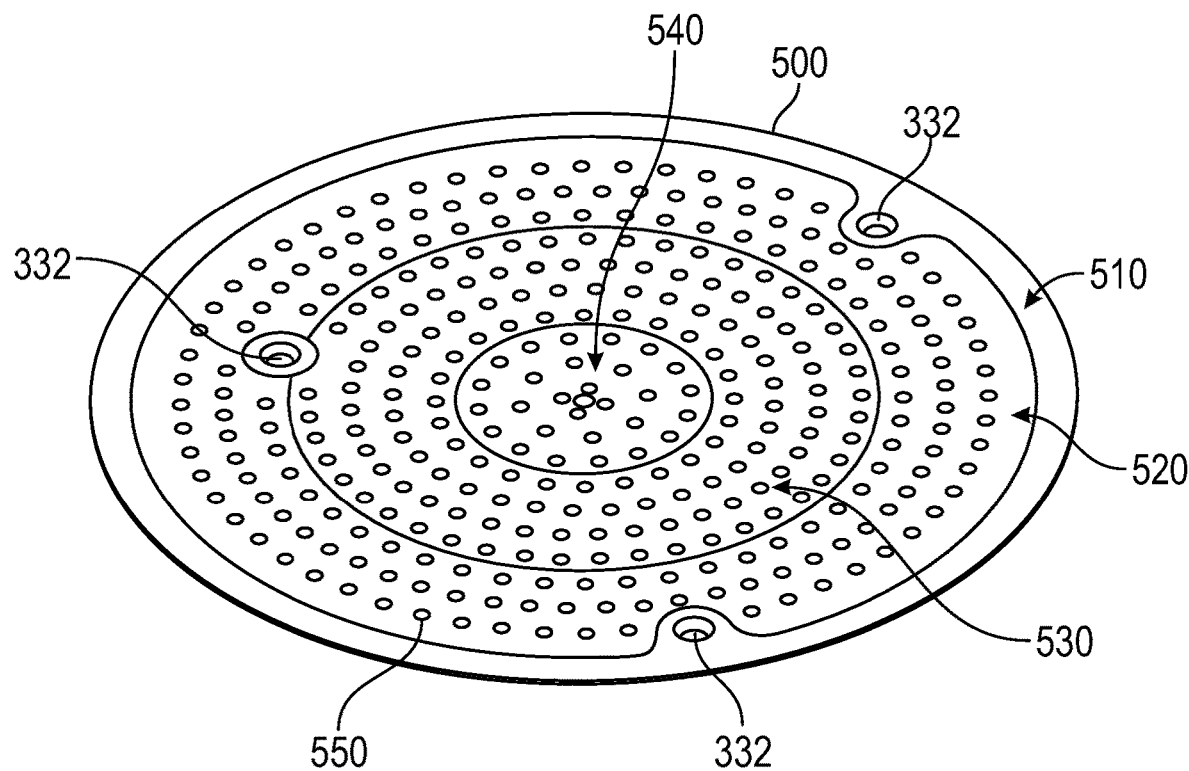
FIGS. 18A and 18B show pocket designs in accordance with one or more embodiment of the disclosure.
Figure 18B:
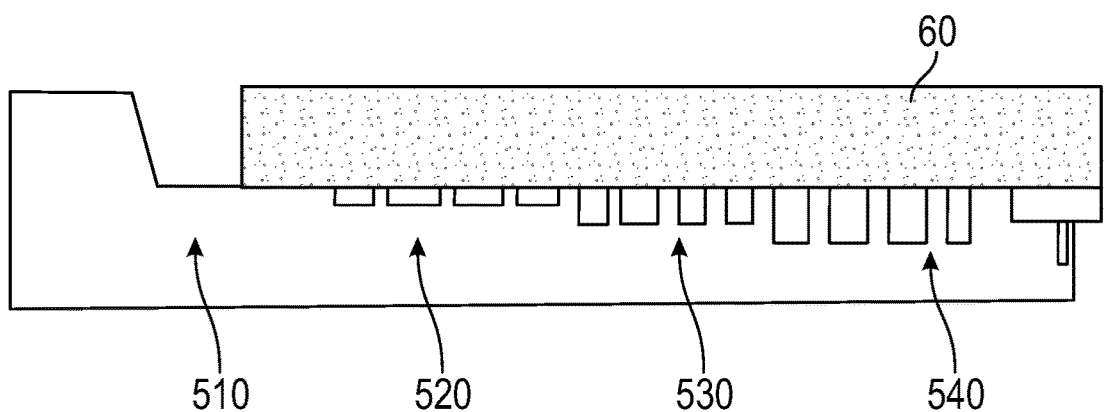

The inventors have found that studying the thermal or film thickness map of a wafer on a carousel susceptor can give clear thermal signatures (hot or cold) areas that can be compensated for thermal or film thickness uniformity. Current pocket 500 designs (POR), as shown in FIGS. 18A and 18B, have an outer peripheral edge 510 with three zones 520, 530, 540. FIG. 18B shows a partial cross-section of the recess with three valley heights of 2 mil-3 mil-4 mil (center)-3 mil-2 mil valleys which is populated with hundreds of small 2.5 mm diameter mesas 550. Large thermal ripples (between the concentric circles of mesas which are 15 mm apart) of greater than 1° C. are seen along with a wafer edge temperature rise of >1° C. Radially, there is a total drop of about 15.5° C. going from outer diameter of pocket to center of pocket. This thermal drop gives several multiples of film thickness drops.

Figure 19A:
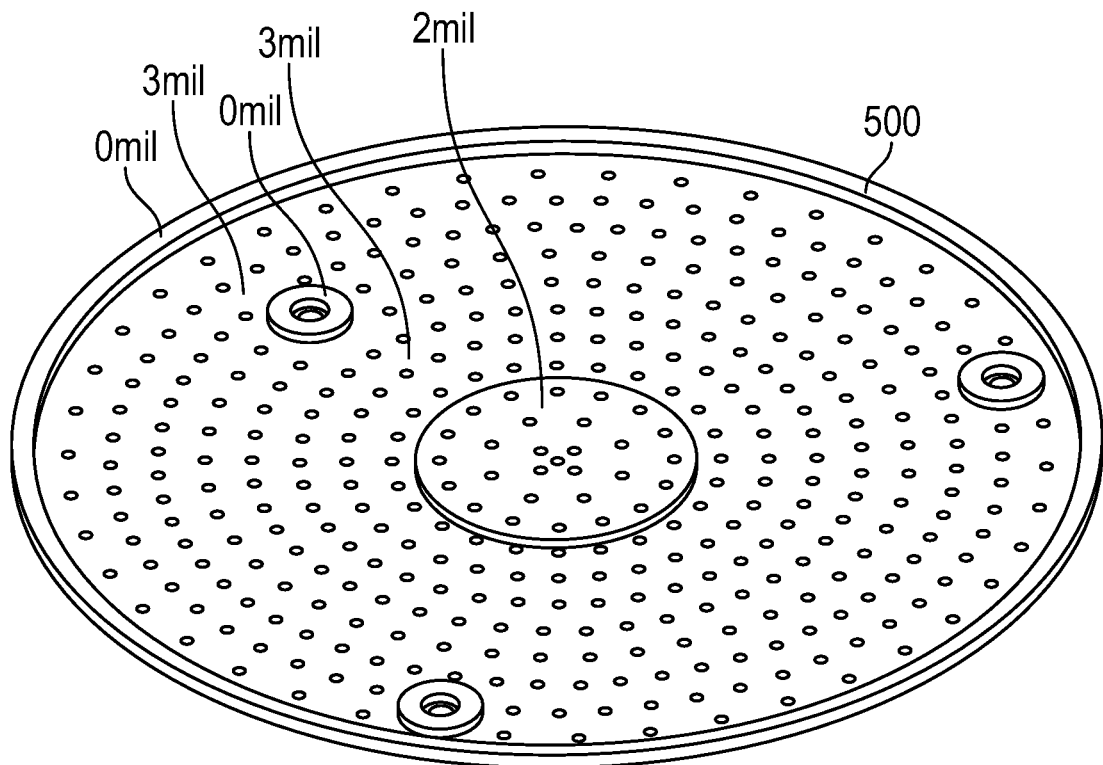
FIGS. 19A and 19B show pocket designs in accordance with one or more embodiments of the disclosure.
Figure 19B:
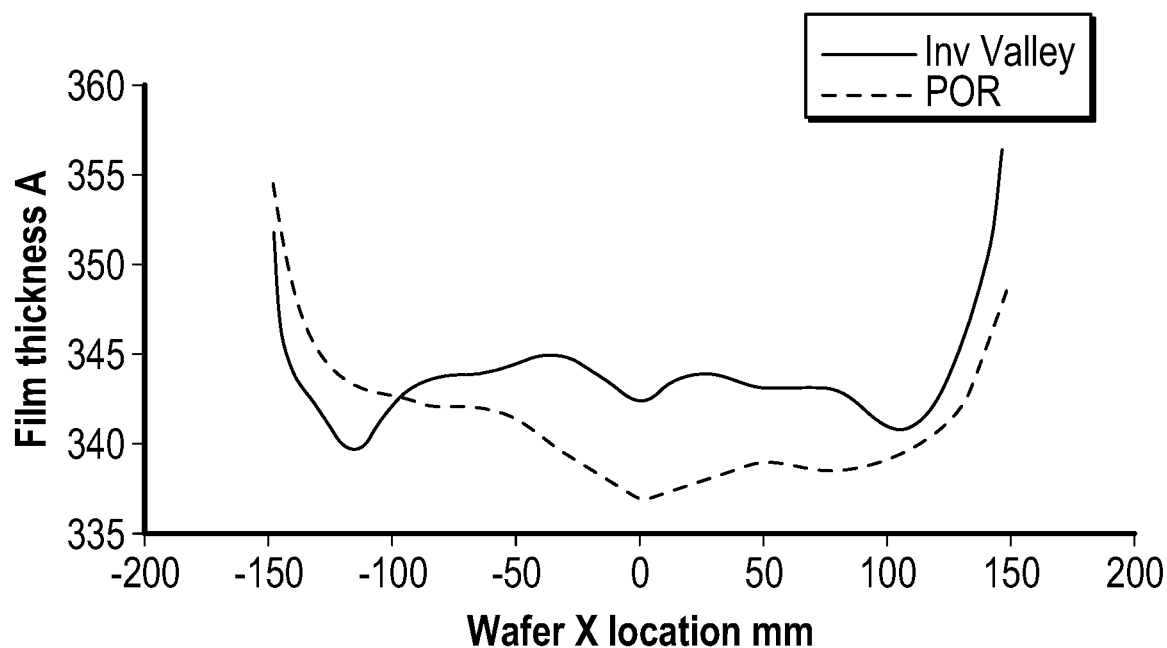

An embodiment of a pocket 500 shown in FIG. 19A has inverse valleys to improve uniformity and conformality of films. Current pocket has 2 mil-3 mil-4 mil (center)-3 mil-2 mil across a diameter, with top of mesa on same plane as the outer diameter seal ledge. An inverse valley has 4 mil-3 mil-2 mil (center)-3 mil-4 mil or 3 mil-3 mil-2 mil (center)-3 mil-3 mil. Every 1 mil increase in valley depth increases temperature by about 1° C. on wafer. FIG. 19B shows a graph of the film thickness as a function of wafer location in the pocket with zero at the center of the pocket. It can be seen that the film thickness for the inverse valleys is more uniform than the POR pocket.

In another embodiment, a thin (2-3 mm thick) ceramic (Alumina, Quartz) L-shaped (in cross-section) ring insert sits in a tightly machined circular channel in the pocket around the outer diameter of the pocket. Because of lower thermal conductivity of Alumina or Quartz, the wafer thermal uniformity is brought down from 15.5° C. to 9.1° C. with Alumina and to 4.4° C. with Quartz rings. Some embodiments do not include a ceramic insert but have an inert gas flowing through the circular channel. Because nitrogen gas has low thermal conductivity, the uniformity is increased. However, the gas flow might be managed to prevent trapping of process gases and parasitic CVD reactions.

Figure 20:
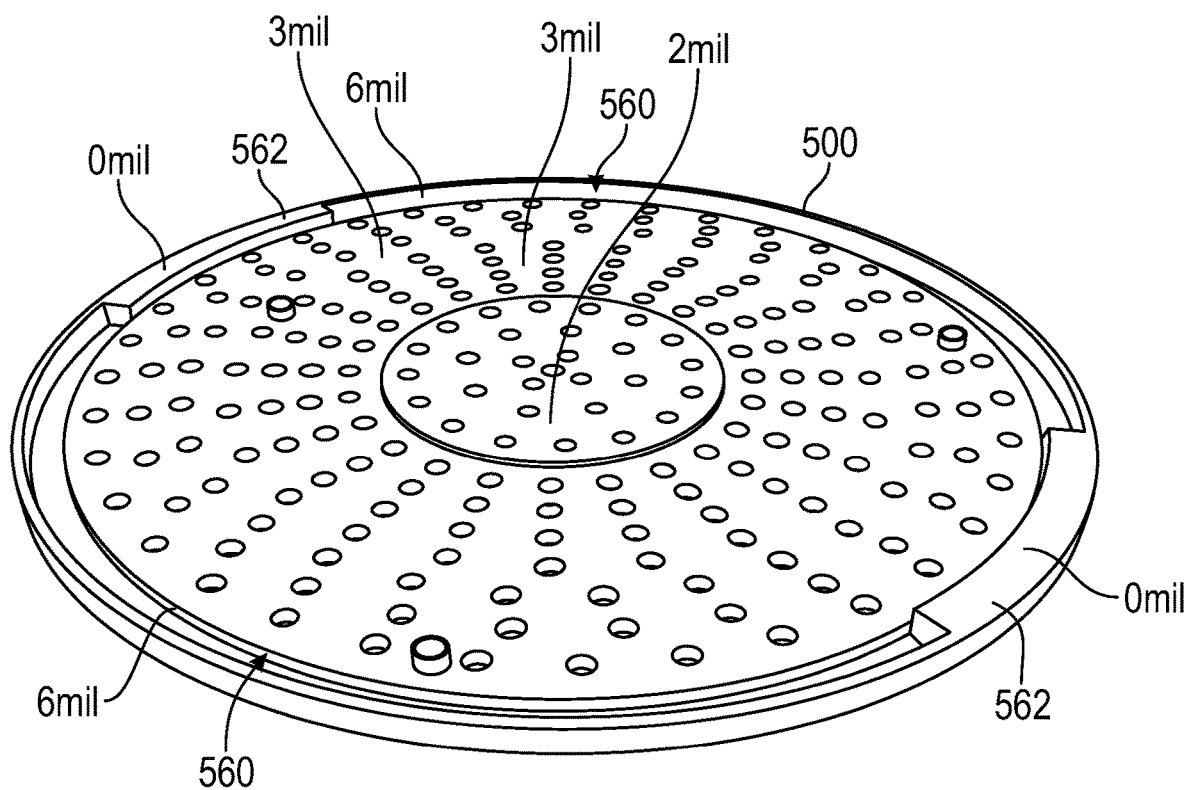
FIG. 20 shows a pocket design in accordance with one or more embodiment of the disclosure.

The embodiment shown in FIG. 20 includes a contoured pocket 500 design where the hot spots/arcs (typically at 4'O clock & 8'O clock positions) on wafer edge are mitigated by digging a 6 mil deep trench 560 wide and long enough to equalize temperature on wafer. Because of the trench 560 there is no direct contact of thermally conductive silicon carbide with the wafer and hence the temperature drops. The embodiment shown has a flat segment 562 bisecting the two trench 560 regions.

Figure 21:
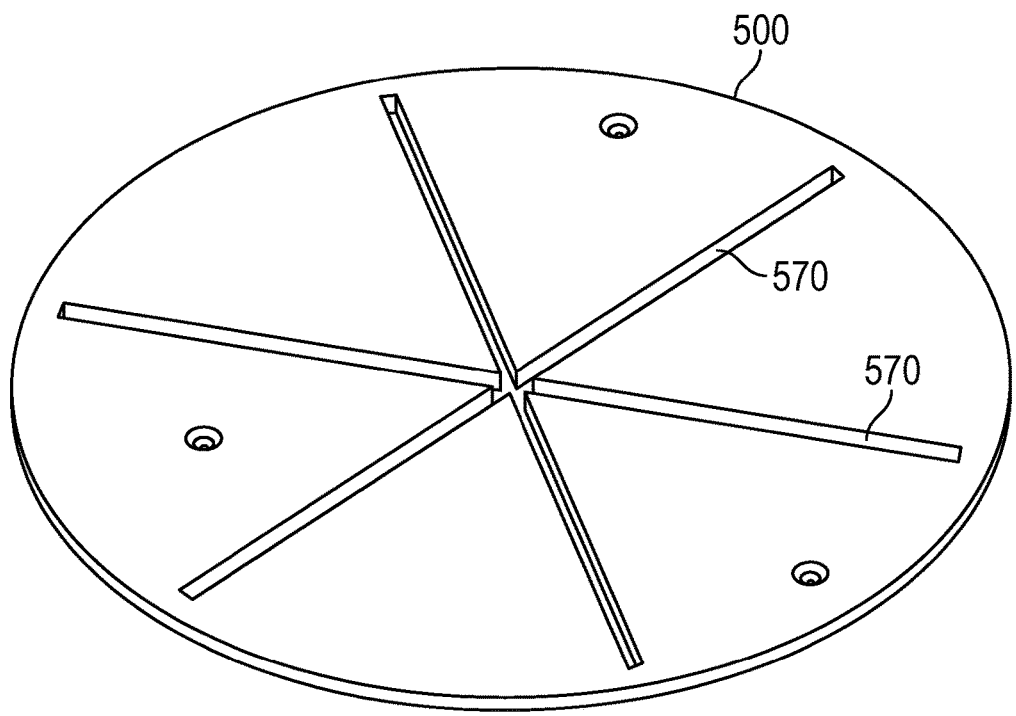
FIG. 21 shows a pocket design in accordance with one or more embodiment of the disclosure.

Another embodiment, as shown in FIG. 21, has a flat pocket 500 design. A thermal study indicated that higher contact area with the wafer gives a faster equilibration time to steady state and better through-put times. The flat pocket design, which provides full contact, does not have any mesas. The pocket 500 includes a few cross-grooves 570 of 1 mm wide×6 mil deep, just enough for vacuum chucking the wafer down. In some embodiments, the cross-grooves have a width in the range of about 0.5 mm to about 2 mm and a depth in the range of about 2 mil to about 10 mil. It was observed that there were no thermal ripples observed.

Figure 22:
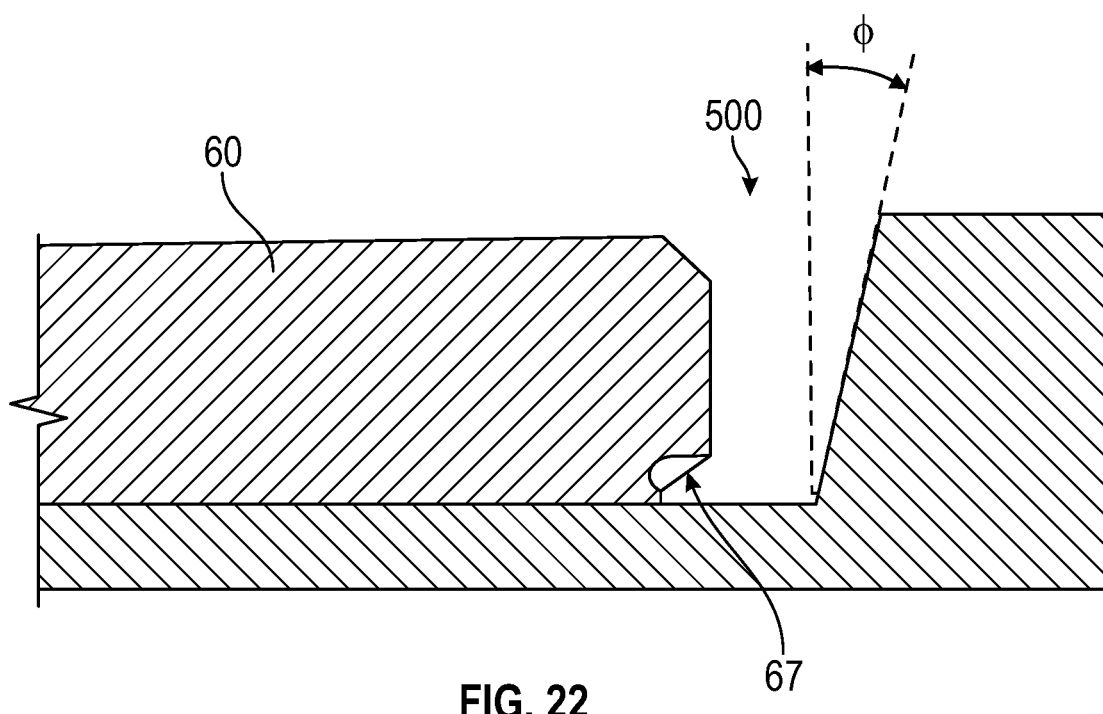
FIG. 22 shows a pocket design in accordance with one or more embodiment of the disclosure.

Another embodiment, as shown in FIG. 22, has slightly wider pocket diameters to mitigate wafer edge chipping 67 issues and reduce wafer edge temperature around the perimeter of wafer. In the embodiment shown, the top of the pocket has a diameter about 1 mm greater than the bottom of the pocket resulting in an angle θ of about 15°. In some embodiments, the angle formed by the difference in diameter of the top of the pocket and the bottom of the pocket is in the range of about 5° to about 30°, or in the range of about 10° to about 20°.

Figure 23A:
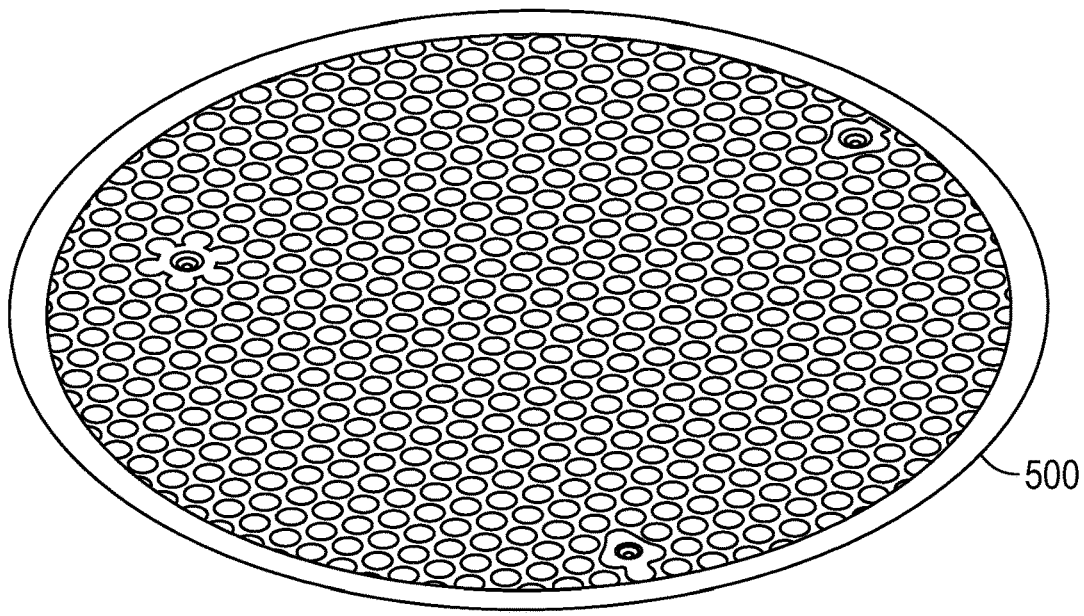
FIGS. 23A and 23B show pocket designs in accordance with one or more embodiment of the disclosure.
Figure 23B:
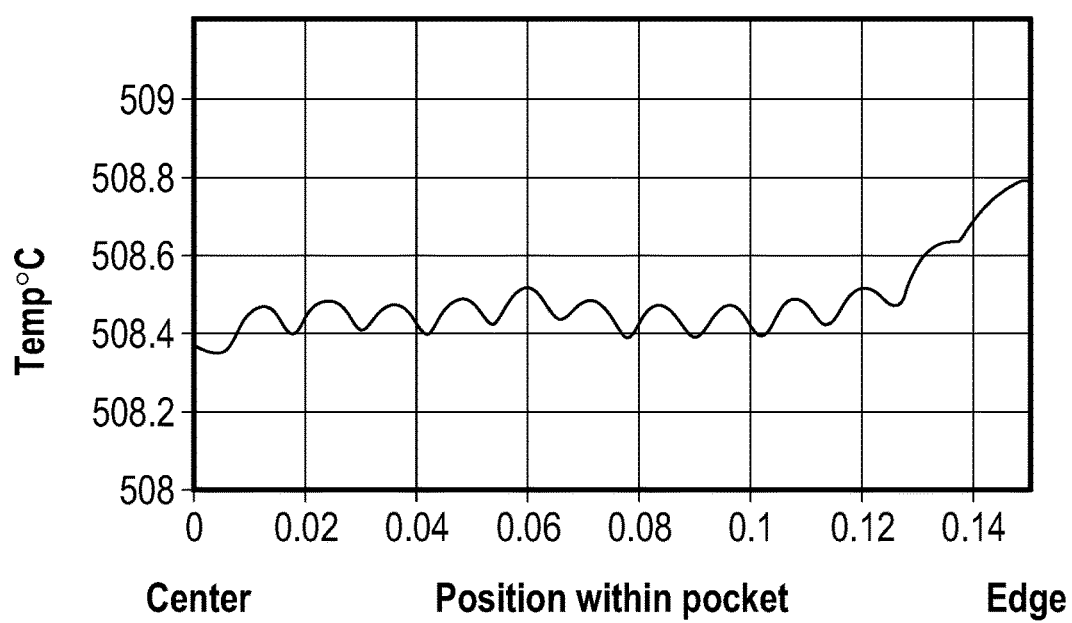

FIGS. 23A and 23B show another embodiment of a pocket 500 with improved chucking force at higher speeds of susceptor rotation. More vacuum grooves can be created with a honeycomb pocket design with densely populated large mesas of about 10 mm. The mesas can have diameters in the range of about 5 mm to about 15 mm. According to a thermal study, it was found that higher contact area with wafer gives faster time to steady state for better through-put times. The valley depths between mesas can be kept to about 1 mil, 2 mil, 3 mil or 4 mil. Without being bound by any theory of operation, it is believed that the honeycomb design has densely populated mesas in x-y direction merging with circular pocket ledge, there may be some partial mesas, the minimum size of which are kept at >2 mm (>1.5 mm, >2.5 mm or >3 mm), because of machinability issue. Also a 2 mm (1 mm to 3 mm) wide spacing is kept between the inner ledge of pocket to the nearest mesa. This design creates a very low thermal ripple of <0.2° C. and an edge temperature rise of 0.4° C. FIG. 23B shows a graph of the temperature as a function of position from the center of the pocket.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, annealing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present disclosure are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, anneal, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, similar to a conveyer system, in which multiple substrate are individually loaded into a first part of the chamber, move through the chamber and are unloaded from a second part of the chamber. The shape of the chamber and associated conveyer system can form a straight path or curved path.

Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discrete steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

In atomic layer deposition type chambers, the substrate can be exposed to the first and second precursors either spatially or temporally separated processes. Temporal ALD is a traditional process in which the first precursor flows into the chamber to react with the surface. The first precursor is purged from the chamber before flowing the second precursor. In spatial ALD, both the first and second precursors are simultaneously flowed to the chamber but are separated spatially so that there is a region between the flows that prevents mixing of the precursors. In spatial ALD, the substrate is moved relative to the gas distribution plate, or vice-versa.

In embodiments, where one or more of the parts of the methods takes place in one chamber, the process may be a spatial ALD process. Although one or more of the chemistries described above may not be compatible (i.e., result in reaction other than on the substrate surface and/or deposit on the chamber), spatial separation ensures that the reagents are not exposed to each in the gas phase. For example, temporal ALD involves the purging the deposition chamber. However, in practice it is sometimes not possible to purge the excess reagent out of the chamber before flowing in additional regent. Therefore, any leftover reagent in the chamber may react. With spatial separation, excess reagent does not need to be purged, and cross-contamination is limited. Furthermore, a lot of time can be used to purge a chamber, and therefore throughput can be increased by eliminating the purge step.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A susceptor assembly comprising:
   a susceptor base;
   a plurality of pie-shaped skins on the susceptor base, each of the pie-shaped skins having a recess; and
   a pie anchor in a center of the susceptor base, the pie anchor configured to cooperatively interact with the pie-shaped skins to hold the pie-shaped skins in place,
   wherein the pie anchor comprises at least one protrusion and the pie-shaped skin has at least one recess adjacent an inner peripheral edge of the pie-shaped skin and sized to cooperatively interact with the at least one protrusion on the pie anchor, and
   the susceptor base comprises at least one protrusion adjacent an outer peripheral edge and the pie-shaped skin has at least one recess adjacent an outer peripheral edge of the pie-shaped skin and sized to cooperatively interact with the at least one protrusion on the susceptor base.

2. The susceptor assembly of claim 1, wherein the recess has a depth substantially the same as a substrate to be positioned within the recess.

3. The susceptor assembly of claim 1, wherein the pie-shaped skin comprises a protrusion adjacent an inner peripheral edge and a protrusion adjacent an outer peripheral edge.

4. The susceptor assembly of claim 3, wherein the susceptor base has a recess adjacent an outer peripheral edge and the pie anchor comprises a recess positioned and sized to cooperatively interact with the protrusions on the pie-shaped skin.

5. The susceptor assembly of claim 1, further comprising a clamp plate over the pie anchor and inner peripheral edge of the plurality of pie-shaped skins.

6. The susceptor assembly of claim 1, wherein the susceptor base is made of a material comprising graphite.

7. The susceptor assembly of claim 6, wherein the susceptor base has a thickness in the range of 20 mm to 40 mm.

8. The susceptor assembly of claim 1, wherein the pie-shaped skins are made from a material comprising a ceramic.

9. The susceptor assembly of claim 1, wherein the pie anchor comprises six protrusions and the pie-shaped skin has six recesses adjacent an inner peripheral edge of the pie-shaped skin and sized to cooperatively interact with each of the six protrusions on the pie anchor.

* * * * *